United States Patent [19]

Korowitz

[11] 3,971,014

[45] July 20, 1976

[54] BI-DIRECTIONAL TRANSLATOR

[75] Inventor: Simon Korowitz, Hatfield, Pa.

[73] Assignee: Sperry Rand Corporation, New York, N.Y.

[22] Filed: Oct. 7, 1974

[21] Appl. No.: 512,921

[52] U.S. Cl. .................................... 340/347 DD
[51] Int. Cl.² ............................................ G06F 3/00
[58] Field of Search .................. 340/172.5, 347 DD; 178/2 B, 26 R, 26 A, 81, 18 ET

[56] References Cited
UNITED STATES PATENTS

| | | | |
|---|---|---|---|
| 3,400,375 | 9/1968 | Bowling et al. .................. | 340/172.5 |
| 3,501,747 | 3/1970 | Bungard et al. .................. | 340/172.5 |
| 3,653,028 | 3/1972 | Cuccio ............................ | 340/324 A |
| 3,701,856 | 10/1972 | Stuck et al. ...................... | 128/26 A |

*Primary Examiner*—Charles D. Miller
*Attorney, Agent, or Firm*—Griffin, Branigan and Butler

[57] ABSTRACT

A bi-directional translator may operate in a transmit non-translate mode or a transmit translate mode. In the transmit translate mode input characters in a first code appearing on a first input bus address a read only memory to read out second code translations of the characters on a first output bus. In the transmit non-translate mode the input characters are gated to the first output bus without addressing the memory. The translator may also operate in a receive translate mode or a receive non-translate mode. In the receive translate mode characters in the second code appearing on a second input bus address the memory to read out first code translations of the characters on a second output bus. In the receive non-translate mode characters in the first code appearing on the second input bus are gated to the second output bus without addressing the memory. In the first code the case of each character (upper or lower) is determined by a bit position within the character whereas the second code requires two special case characters which determine the case of the characters following them. The translator inserts the required case characters in the outgoing character sequence when operating in the transmit translate mode, and eliminates the case characters from an incoming character sequence when operating in the receive translate mode. Since the first code includes more characters than the second code, provision is made for recognizing characters of the first code having no equivalent in the second code, and preventing any character output in response to such a recognized character.

22 Claims, 6 Drawing Figures

BI-DIRECTIONAL TRANSLATOR

BACKGROUND OF THE INVENTION

The present invention relates to bi-directional translators and more particularly to a bi-directional translator suitable for use in a system wherein a local word processor operating in a first code may selectively communicate over a telephone line with a remote word processor operating in the same code or a central processor unit operating in a second code.

Bi-directional translators are well known in the art. Some of these, as exemplified by U.S. Pat. Nos. 3,701,856 and 3,293,618 are capable of translating characters received in any one of a plurality of codes into characters in any other one of the plurality of codes. This is accomplished by addressing a memory with a character in one code to read out a translation of the character in a second code. However, some translators of the prior art have been unduly complex, requiring one or more memory address registers and one or more output buffer registers. Furthermore, some prior art translators have been wasteful of memory space in that each memory address has had two characters stored therein. In there translators one stored character represents the translation of the addressing character in a second code whereas the other stored character is the same as the addressing character, i.e. the same character in the same code. A selection is then made between the characters read out of memory depending upon whether the addressing character is to be transmitted with or without translation. Obviously in addition to wasting memory space, these translators require additional time to address the memory even though the addressing character is to be transmitted without translation.

In the UNIVAC* code the case of each character (upper case or lower case) is determined by the value of one bit in the character itself. On the other hand, in the IBM Correspondence Code two special case characters are provided, each case character determining the case of the character or characters following it. Furthermore, the UNIVAC* code includes characters for which there are no equivalent characters in the IBM Correspondence Code. These differences in the codes present special problems that are not solved by the translators of the prior art. For example, in translating from the UNIVAC* to the IBM Correspondence Code provision must be made for inserting a case character into the outgoing data stream each time the case of an incoming character is different from the case of the preceding outgoing character. When translating from the IBM Correspondence Code to the UNIVAC* code provision must be made for deleting the characters designating upper case and lower case from the outgoing data stream. Finally, it is desirable when translating from the UNIVAC* to IBM Correspondence Code to save as much time as possible by not transmitting a blank (Space character) if the character being translated has no equivalent in the IBM Correspondence Code.

SUMMARY OF THE INVENTION

An object of the present invention is to provide a bi-directional translator responsive to characters in the UNIVAC* or IBM Correspondence Code for producing output characters in one or the other of said codes.

An object of the present invention is to provide a translator responsive to input data characters in a first code for selectively producing output data characters in the first code or a second code, the translator including data selector means, memory means having addressing inputs responsive to input data characters and outputs connected to the data selector means, means for applying the input data characters to the data selector means, and control means for selectively generating signals that are applied to the data selector means to select as the output therefrom either the input data character or a translation thereof in the second code as provided from the memory means. The memory means has stored therein at various locations the codes representing characters in the second code, the codes being stored such that a character in the first code when applied to the memory means addresses the location that stores the code of the equivalent character in the second code.

Another object of the invention is to provide a bi-directional translator comprising an input data selector, first and second output data selectors, a read only memory addressable by output signals from the input data selector and having outputs connected to both the output data selectors, a first input bus connected to the input data selector and the first output data selector, a second input bus connected to the input data selector and the second output data selector, and a translate control means responsive to mode control signals for operating in one of four modes for selectively applying signals to all the data selectors and the memory means. In a first mode characters in a first code applied to the first bus are selected out of the first output data selector. In a second mode characters in a first code appearing on the first input bus are applied to the memory means and a translation of the characters read out of the memory is selected out of the first output data selector. In a third mode characters in the first code appearing on the second input bus are selected out of the second output data selector. In a fourth mode characters in the second code appearing on the second input bus are applied to the memory means and a translation of the characters read out of the memory is selected out of the second output data selector.

A further object of the invention is to provide a translator or bi-directional translator as described in the preceding paragraphs wherein means are provided for inserting codes case characters into the sequence of output characters when translating from the first code to the second code, or for deleting codes for case characters when translating from the second code to the first code, the characters of the first code each including an indication of the case of the character and the second code including an upper case character and a lower case character for designating the case of the characters following the case characters.

A further feature of the invention is the provision of means for preventing an output from the translator when an input character in one code has no equivalent character in the second code.

DESCRIPTION OF A PREFERRED EMBODIMENT

Preliminary Considerations

Figure 1:
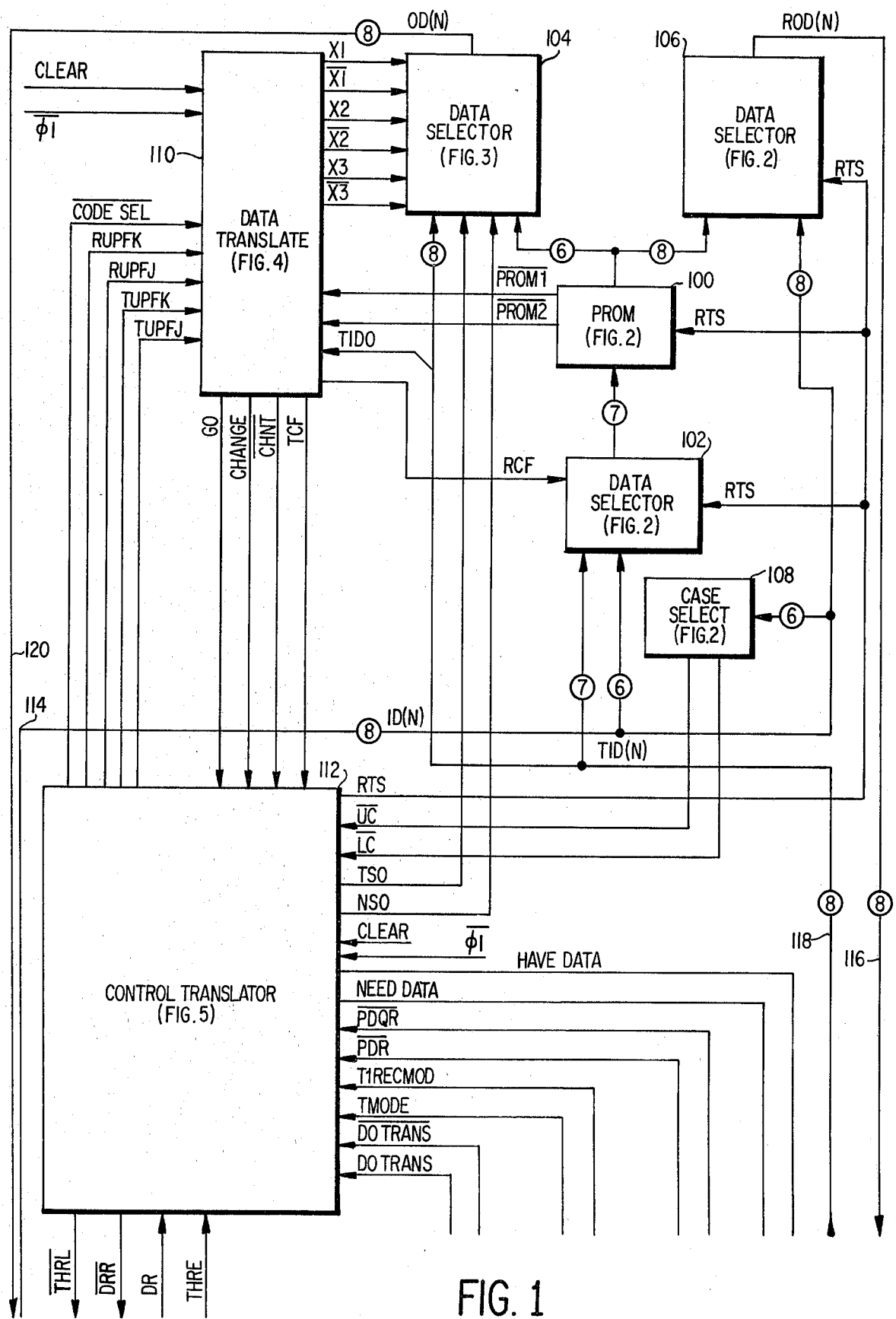
FIG. 1 is a block diagram of a translator according to the invention.

The present invention is intended for use in a system wherein a local word processor or automatic typewriter system operating in the UNIVAC* code communicates over a telephone line with a remote unit which may either be a remote word processor operating in the same code or a central processor unit (CPU) operating in the IBM Correspondence Code. In the UNIVAC* code each character is represented by eight binary bits, LSB-R1-R2-R2A-T1-T2-MSB. The most significant bit (MSB) is a binary 0 for numerals, alphabetic characters, and certain function codes. MSB is a binary 1 for certain special symbols and for other function codes. Tables I and II show the codes assigned to each character where MSB is a zero or a one, respectively.

The bits T2 and T1 are employed in the word processor to control the tilt of the spherical type element which prints the characters while the bits R5, R2A, R2 and R1 control the rotation of the type element. The least significant bit (LSB) indicates whether the character is upper case (LSB=0) or lower case (LSB=1). For example, referring to Table I, the code 11010000 represents the lower case character p whereas the code 01010000 represents the upper case character P.

In the IBM Correspondence Code each character is represented by six binary bits B-A-8-4-2-1. Bits A and B are called zone bits and bits 8, 4, 2 and 1 are called digit bits. In this code two special character codes LC (111110) and UC (001110) are employed to designate the case of characters.

TABLE I

| TILT BITS | | | T2 | 0 | 0 | 0 | 0 | 1 | 1 | 1 | 1 |
|---|---|---|---|---|---|---|---|---|---|---|---|
| | | | T1 | 0 | 0 | 1 | 1 | 0 | 0 | 1 | 1 |
| ROTATE BITS | | | | UNIVAC CHARACTER CODES with MSB = 0 | | | | | | | |
| R5 | R2A | R2 | R1 | LSB=1 | LSB=0 | LSB=1 | LSB=0 | LSB=1 | LSB=0 | LSB=1 | LSB=0 |
| 0 | 0 | 0 | 0 | — | - | w | W | b | B | 9 | ( |
| 0 | 0 | 0 | 1 | y | Y | s | S | h | H | 0 | ) |
| 0 | 0 | 1 | 0 | Set Tab | | BKSP | | Tab | | SCR | |
| 0 | 0 | 1 | 1 | © | | | | UC | | | |
| 0 | 1 | 0 | 0 | q | Q | i | I | k | K | 6 | |
| 0 | 1 | 0 | 1 | p | P | ' | " | e | E | 5 | % |
| 0 | 1 | 1 | 0 | = | + | . | . | n | N | 2 | @ |
| 0 | 1 | 1 | 1 | j | J | ½ | ¼ | t | T | z | Z |
| 1 | 0 | 0 | 0 | | | | | | | | |
| 1 | 0 | 0 | 1 | / | ? | o | O | l | L | 4 | $ |
| 1 | 0 | 1 | 0 | Space | | | | | | CR | |
| 1 | 0 | 1 | 1 | | | Idle | | LC | | Index | |
| 1 | 1 | 0 | 0 | , | , | a | A | c | C | 8 | * |
| 1 | 1 | 0 | 1 | ; | : | r | R | d | D | 7 | & |
| 1 | 1 | 1 | 0 | f | F | v | V | " | U | 3 | # |
| 1 | 1 | 1 | 1 | g | G | m | M | x | X | ] | [ |

TABLE II

| TILT BITS | | | T2 | 0 | 0 | 0 | 0 | 1 | 1 | 1 | 1 |
|---|---|---|---|---|---|---|---|---|---|---|---|
| | | | T1 | 0 | 0 | 1 | 1 | 0 | 0 | 1 | 1 |
| ROTATE BITS | | | | UNIVAC CHARACTER CODES with MSB = 1 | | | | | | | |
| R5 | R2A | R2 | R1 | LSB=1 | LSB=0 | LSB=1 | LSB=0 | LSB=1 | LSB=0 | LSB=1 | LSB=0 |
| 0 | 0 | 0 | 0 | ̸ | L̸ | ẘ | W̊ | ƀ | Ƀ | ̸ | X̸ |
| 0 | 0 | 0 | 1 | ẏ | Ẏ | ṣ | Ṣ | ħ | Ħ | ̸ | ̸ |
| 0 | 0 | 1 | 0 | | | Req. BKSP | | Req. Tab | | Req. SCR | |
| 0 | 0 | 1 | 1 | © | | | | | | | |
| 0 | 1 | 0 | 0 | q̸ | Q̸ | ı̸ | Ɨ | ƙ | Ƙ | ̸ | ̸ |
| 0 | 1 | 0 | 1 | p̸ | P̸ | ̸ | ̸ | ¢ | Ɇ | ̸ | ̸ |
| 0 | 1 | 1 | 0 | ≠ | ≁ | ̸ | ̸ | ń | Ń | ƶ | @̸ |
| 0 | 1 | 1 | 1 | j̸ | J̸ | ̸ | ̸ | ̸ | T̸ | ż | Ƶ |
| 1 | 0 | 0 | 0 | | | | | | | | |
| 1 | 0 | 0 | 1 | / | ?̸ | ø | Ø | ł | Ł | ̸ | $̸ |
| 1 | 0 | 1 | 0 | Req. Space | | Clr. Tab | | | | Req. CR | |
| 1 | 0 | 1 | 1 | | | | | | | | |
| 1 | 1 | 0 | 0 | ̸ | ̸ | ạ | Ạ | ¢ | ¢ | ̸ | ̸ |
| 1 | 1 | 0 | 1 | ̸ | ̸ | ̸ | Ɍ | đ | Đ | ̸ | ̸ |
| 1 | 1 | 1 | 0 | f̸ | F̸ | ̸ | V̸ | ̸ | Ʉ | ̸ | ̸ |
| 1 | 1 | 1 | 1 | ̸ | Ǥ | m̸ | M̸ | x̸ | X̸ | ̸ | ̸ |

TABLE III

| 8 | 4 | 2 | 1 | IBM CORRESPONDENCE CODE | | | | | | | |
|---|---|---|---|---|---|---|---|---|---|---|---|
| ZONE BITS A | | | | 0 | 0 | 0 | 0 | 1 | 1 | 1 | 1 |
| DIGIT BITS B | | | | 0 | 0 | 1 | 1 | 0 | 0 | 1 | 1 |
| 8 | 4 | 2 | 1 | LC | UC | LC | UC | LC | UC | LC | UC |
| 0 | 0 | 0 | 0 | Space | Req. Space | ½ | ¼ | t | T | j | J |
| 0 | 0 | 0 | 1 | 1 | [ | m | M | x | X | g | G |
| 0 | 0 | 1 | 0 | 2 | @ | . | . | n | N | = | ÷ |
| 0 | 0 | 1 | 1 | 3 | # | v | V | u | U | f | F |
| 0 | 1 | 0 | 0 | 5 | % | ' | " | e | E | p | P |
| 0 | 1 | 0 | 1 | 7 | & | r | R | d | D | ; | : |
| 0 | 1 | 1 | 0 | 6 |  | i | I | k | K | q | Q |
| 0 | 1 | 1 | 1 | 8 | * | a | A | c | C | , | . |
| 1 | 0 | 0 | 0 |  | $ | o | O | l | L | / | ? |
| 1 | 0 | 0 | 1 | 0 | ) | s | S | h | H | y | Y |
| 1 | 0 | 1 | 0 | z | Z |  |  | Stop |  |  |  |
| 1 | 0 | 1 | 1 | 9 | ( | w | W | b | B | — | _ |
| 1 | 1 | 0 | 0 |  |  |  |  |  |  |  |  |
| 1 | 1 | 0 | 1 |  |  | CR | Req. CR | Index | Index | Tab | Req. Tab |
| 1 | 1 | 1 | 0 | UC | UC | BKSP | Req. BKSP |  |  | LC | LC |
| 1 | 1 | 1 | 1 | © | © | Idle | Idle |  |  |  |  |

Any characters or stream of characters following LC are treated as lower case characters and any character or characters following UC are treated as upper case characters. Table III shows the codes assigned to the characters in the IBM Correspondence Code. Referring to this table, it is seen, for example, that the code for p and the code for P is the same. Both are 110100. The code is treated as representing P if the last case character preceding it was UC, and is treated as p if the last case character preceding it was LC.

In considering Tables I-III it should be noted that the UNIVAC code provides for up to 256 characters whereas the IBM Correspondence Code provides for only 128 characters.

In the following description reference is made to "low level" or logical zero and "high level" or logical one. This of course is determined by the logic elements employed and this convention could be reversed if different logic elements are employed.

For ease of reference, the reference numerals used to designate circuit elements in the following description have been chosen such that the first digit of the reference numeral designates the figure where the element is shown.

General Description - FIG. 1

A preferred embodiment of a translator constructed in accordance with the principles of the present invention comprises a programmable read only memory means (PROM) 100, an input data selector 102, first and second output data selectors 104 and 106, a case select or detection circuit 108, a data translate circuit 110, and a control translator circuit 112. The data translate circuit and the control translator circuit comprises a translate control means for controlling the sequencing of the translator.

The translator may operate in one of four modes designated receive non-translate mode, the receive translate mode, the transmit non-translate mode, and the transmit translate mode. In the receive mode, incoming data received over a telephone line serial by bit is converted by an I/O Modem (not shown) to parallel by bit serial by character format, and the resulting character signals are applied in parallel over a bus 114 to one input of data selector 102 and one input of data selector 106. If the incoming characters are in the UNIVAC* code the translator is set to operate in the receive non-translate mode and the characters are gated through data selector 106 without change. The characters are then applied over a bus 116 to an interface circuit (not shown) which reconverts each character to the serial by bit format. The output of the interface circuit is applied to a local automatic typewriter system or word processor of the type currently marketed by the Sperry Rand Corporation.

If the incoming characters on bus 114 are in the IBM Correspondence Code then the characters must each be converted to the UNIVAC* code before being applied to bus 116. The translator is set to operate in the receive translate mode. The signals representing each character are gated through data selector 102 and are applied as address signals to PROM 100. As each character addresses PROM 100, the signals representing the same character in the UNIVAC* code are read out of the memory to data selector 106. From the data selector the characters are passed over bus 116 to the local word processor interface circuit in the manner previously explain.

The translator of FIG. 1 also permits a local word processor operating in the UNIVAC* code to transmit over telephone lines to a remote word processor operating in the same code or a central processing unit operating in the IBM Correspondence Code. The local word processor applies a serial by bit output to the interface circuit previously mentioned and the interface circuit converts this information to parallel by bit serial by character format before applying it to a bus 118. This bus is connected to the inputs of data selectors 102 and 104. If the output of the local word processor is to be applied to the telephone lines in the UNIVAC* code for transmission to a remote word processor then the translator is set for the transmit nontranslate mode and the characters are passed one at a time through data selector 104 onto a bus 120. Bus 120 is connected to the telephone line through the I/O Modem previously mentioned so that the characters are converted to serial by bit format before being applied to the telephone line.

Should the local word processor operating in the UNIVAC* code desire to transmit data over a telephone line to a central processing unit operating in the IBM Correspondence Code, the circuit of FIG. 1 is set for the transmit translate mode whereby it translates each character from one code to the other before it is transmitted. As each character is applied to the bus 118 it is passed through data selector 102 to address PROM 100. The IBM Correspondence Code character is read out of PROM 100 and is passed through data selector 104 onto bus 120 from whence it passes through the I/O Modem for application to the telephone line.

The foregoing explanation of FIG. 1 has been greatly simplified in order to illustrate the paths followed by data in passing through the translator. No mention has been made of the upper-lower case control that is required regardless of the direction of the translation. When the translator is set for the receive translate mode case select circuit 108 continuously monitors incoming characters on bus 114 and generates one of the signals UC or LC when one of the case characters of the IBM Correspondence Code is received. The signals UC and LC are applied to control translator 112 and the translator in turn produces signals to set or reset a receive case flag or flip-flop in the data translate circuit 110. The output of the receive case flip-flop is the signal RCF and this signal is applied to data selector 102 along with the six bits of each succeeding incoming character. Thus, the receive case flag in combination with the six bits of each succeeding incoming character determines which address of PROM 100 is read out through data selector 106 to the bus 116.

In the transmit translate mode, characters applied to bus 118 in the UNIVAC* code are to be translated to the IBM Correspondence Code before being applied to bus 120. The least significant bit of each character on bus 118 is sensed by data translate circuit 110. This bit represents the case of the character and is applied to data translate circuit 110 as a signal TIDO. As subsequently explained in greater detail, circuit 110 has a transmit case flag or flip-flop which is set in accordance with the signal TIDO. Generally speaking, the transmit case flag is compared with TIDO to determine whether the present character is of the same case or the opposite case as the preceding character transmitted by the translator. If the cases are the same data translate circuit 110 produces a signal GO which is applied to the control translator 112. Translator 112 produces the signal TSO to gate a character out of an address in PROM 100 through data selector 104. In the transmit modes the signal RTS produces by control translator 112 conditions data selector 102 so that the character on bus 118 address PROM 100. The signal RTS is also used as an address bit for the memory. Therefore, the output of PROM 100 that is gated through data selector 104 is a translation of the character on bus 118.

If the comparison between TIDO and the receive case flag indicates that the present character on bus 118 is of a different case than the last transmitted character, data translate circuit 110 produces a signal CHANGE. This signal is applied to the control translator 112 which in turn produces one of the signals TUPFK or TUPFJ to change the state of the transmit flag. The translator also produces the signal CODE SEL which, in combination with the transmit case flip-flop determines the level of the output signals X1, X2 and X3 from data translate circuit 110. These signals are applied to data selector 104 and cause the data selector to produce on bus 120 the code corresponding to LC or UC. After this is accomplished, data translator circuit 110 produces the GO signal and control translator 112 causes the output of PROM 100 to be gated through data selector 104 onto the output bus 120.

The control translator 112 produces certain signals to indicate when it is ready to receive another character on one of its input buses or when it has another character ready at one of its output buses. When operating in the transmit modes, the control translator sends a signal NEED DATA to the local word processor interface circuit to request that another character be placed on bus 118. The interface circuit responds by placing a character on bus 118 and then returning a signal PDQR to the translator signalling it to proceed. After the translator has processed a character and placed it on bus 120, the translator generates the signal THRL which strobes the character on bus 120 into the I/O Modem. After the I/O Modem processes the character it generates the signal THRE to indicate that it is ready to accept another character.

In the receive modes, the control translate circuit 112 receives the signal DR when the I/O Modem has placed a character on bus 114. After the translator accepts the character it produces the signal DRR to indicate to the I/O Modem that the character has been accepted. The translate control circuit 112 generates the signal HAVE DATA to tell the word processor interface circuit that there is a character ready on bus 116. The interface circuit accepts the character and generates the signal DRR indicating to the translator that the next character may be placed on bus 116.

The functioning of the data translate circuit 110 and the control translate circuit 112 in each of the four modes is explained subsequently in connection with FIGS. 5A and 5B.

Figure 2:
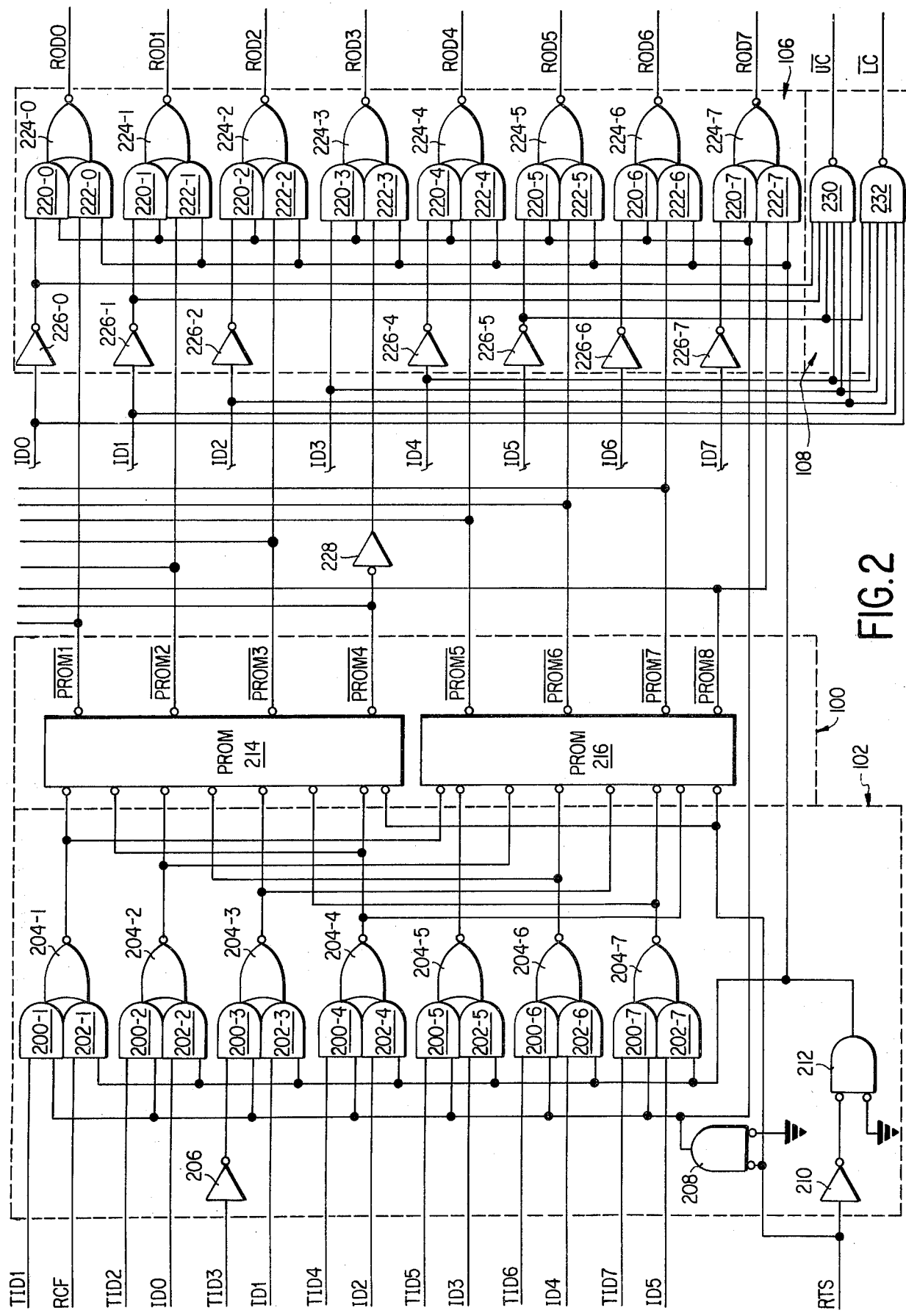
FIG. 2 is a logic diagram showing the input data selector, an output data selector, the read only memory, and the case character detection circuit.

Description of FIG. 2

FIG. 2 shows the details of PROM 100, data selector 102, data selector 106, and the case select circuit 108. Data selector 102 comprises a first set of NAND gates 200-1 through 200-7, a second set of NAND gates 202-1 through 202-7 and a plurality of OR gates 204-1 through 204-7.

A character appearing on bus 118 (FIG. 1) is in the UNIVAC* code and comprises 8 binary bits. The seven most significant bits are applied as inputs TID1 through TID7 to the NAND gates 200-1 through 200-7. The signal TID3 is inverted by an inverter 206 before being applied to NAND 200-3, but the other bits of the character are applied directly to the inputs of the NAND gates. The signal RTS is applied to a NAND gate 208 which has its second input tied to the low logic level. The output of NAND 208 is applied as a second input to the NAND gate 200.

The signal RTS is also applied through an inverter 210 to one input of a NAND gate 212 that has its second input tied to the low level. The output of NAND 212 is applied to one input of each of the gates 202. Gates 202-2 through 202-7 have applied as a second input thereto the signals ID0 through ID5. The signals ID0 through ID5 represent the six low order bits coming into the translator over bus 114. The second input of gate 202-1 is the receive case flag signal RCF that is produced in FIG. 5 as subsequently explained.

The output of gates 200-1 through 200-7 are combined with the outputs of gate 202-1 through 202-7, respectively, at OR gates 204-1 through 204-7. The output of the OR gates are then applied as addressing signals to PROM 100.

If the translator is in the receive translate mode, the signal RTS is at a high level and the signal RCF with the signals ID0 and ID5 are gated through gates 202, with inversion, to address PROM 100. On the other hand, if the translator is in the transmit translate mode the signal RTS is a low level and the signals TID1 through TID7 are gated through gates 200, with inversion, to address PROM 100.

As shown in FIG. 2, PROM 100 comprises two programmable read only memory sections designated PROM 214 and PROM 216. PROM 214 and PROM 216 each contain 256 addresses each capable of storing four binary bits. Of the 256 addresses 128 are allocated for translations when transmitting and 128 addresses are allocated for translations when receiving. The receive-transmit select signal RTS is applied to both PROM 214 and PROM 216 as an address signal and determines from which group of 128 addresses a translated character will be read. The outputs of data selector 102 are applied in parallel to PROM 214 and PROM 216 so that four bits of a translated character are obtained from PROM 214 and the other four bits are obtained from PROM 216.

Data selector 106 is shown in the right hand portion of FIG. 2 and comprises a first set of NAND gates 220-0 through 220-7, a second set of NAND gates 222-0 through 222-7, and a set of OR gates 224-0 through 224-7. The corresponding NAND gates of the two sets have their outputs connected to an input of an OR gate and the output of the OR gates are the signals ROD0 through ROD7 which are applied over bus 116 to the local word processor interface circuit.

The eight conductors in bus 114 carry the signals ID0 through ID7 and these signals are applied as one input to a respective one of the NAND gates 220-0 through 220-7. The signal ID3 is applied directly to NAND 220-3 whereas the signals ID0 through ID2 and ID4 through ID7 are passed through a set of inverters 226 before being applied to the input of the NAND gates 220.

The signals PROM 1 through PROM 8 from PROM 100 are applied as input signals to NAND gates 222-0 through 222-7 respectively. All of the output signals from PROM 100 are applied directly to the gates 222 except for PROM 4 which is passed through an inverter 228 before being applied to the input of gate 222-3. The signal RTS appearing at the output of gate 212 is applied as a second input to each of gates 222 whereas the complement of the signal RTS appearing at the output of NAND 208 is applied as one input to each of the gates 220. Therefore, if the translator is operating in the receive mode with translation required, the output of PROM 100 is gated through gates 222, with inversion, and onto the bus 116 as the signals ROD0 through ROD7. On the other hand, if the translator is operating in the receive mode with no translation required then the signals ID0 through ID7 appearing on bus 114 are gated through the gates 220 onto the bus 116 as the signals ROD0 through ROD7.

The case select or detector circuit 108 is shown in the lower right portion of FIG. 2 and comprises two NAND gates 230 and 232. The upper case character detector 230 has as its input the signals ID0, ID1, and ID5 from the outputs of inverters 226-0, 226-1, and 226-5. In addition, detector 230 receives the signals ID2, ID3, and ID4 directly from the bus 114. Therefore, if the upper case character 001110 appears on bus 114 detector 230 produces the low level signal UC indicating that the following character or characters on the bus are to be translated as upper case characters.

Lower case detector 232 receives the signals ID0, ID1, ID2, ID3, and ID4, as well as the signal ID5 derived from the output of inverter 226-5. If the lower case character 111110 appears on bus 114 then detector 232 produces the low level signal LC indicating that the following character or characters on bus 114 are to be translated as lower case characters.

Figure 3:
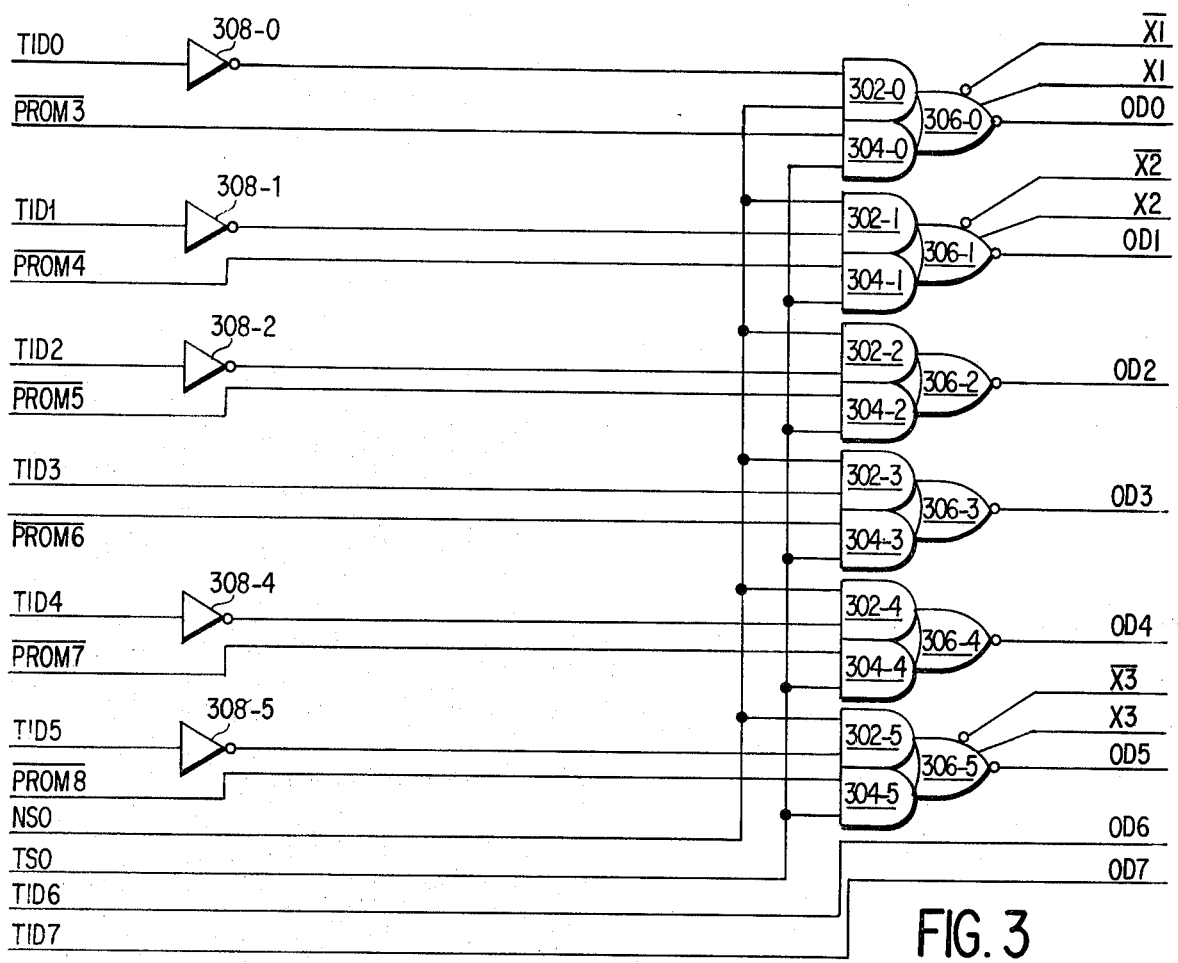
FIG. 3 is a logic diagram of a second output data selector.

FIG. 3 shows the details of data selector 104. The selector includes a first set of NAND gates 302-0 through 302-5, a second set of NAND gates 304-0 through 304-5, and a set of OR gates 306-0 through 306-5. Each gate 302 has as one input thereto a signal derived from bus 118. The signal TID3 is applied directly to the input of gate 302-3 but the signals TID0, TID1, TID2, TID4, and TID5 are inverted by amplifiers 308 before being applied to respective inputs of gates 302. All of the gates 302 receive the signal NSO which is at a high level when the characters on bus 118 are to be applied to bus 120 without translation. The outputs of gates 302 are applied through gates 306 to the leads OD0 through OD5, these leads being in the output bus 120. As with data selector 102 and 106, a signal inversion takes place as the character signals are gated through the data selector 106, this inversion occuring at the selection gates 302 or 304.

Bit positions 3 through 8 of PROM 100 are connected as one input to gates 304-0 through 304-5, respectively. The gates 304 receive as their second input the signal TSO which is at a high level when data on bus 118 is to be translated before being applied to output bus 120. The outputs of the gates 304 are applied through gates 306 to the leads OD0 through OD5 in the output bus 120. The signals TID6 and TID7 representing the two highest order bits of the character on bus 118 are passed through data selector 104 to become the two bits OD6 and OD7 in output bus 120. Although this permits two bits on the bus 118 to appear on bus 120 even when a translation is required, this presents no problems since the I/O Modem contemplated for use with the invention will ignore OD6 and OD7 when it serializes output characters in the IBM Correspondence Code.

Figure 4:
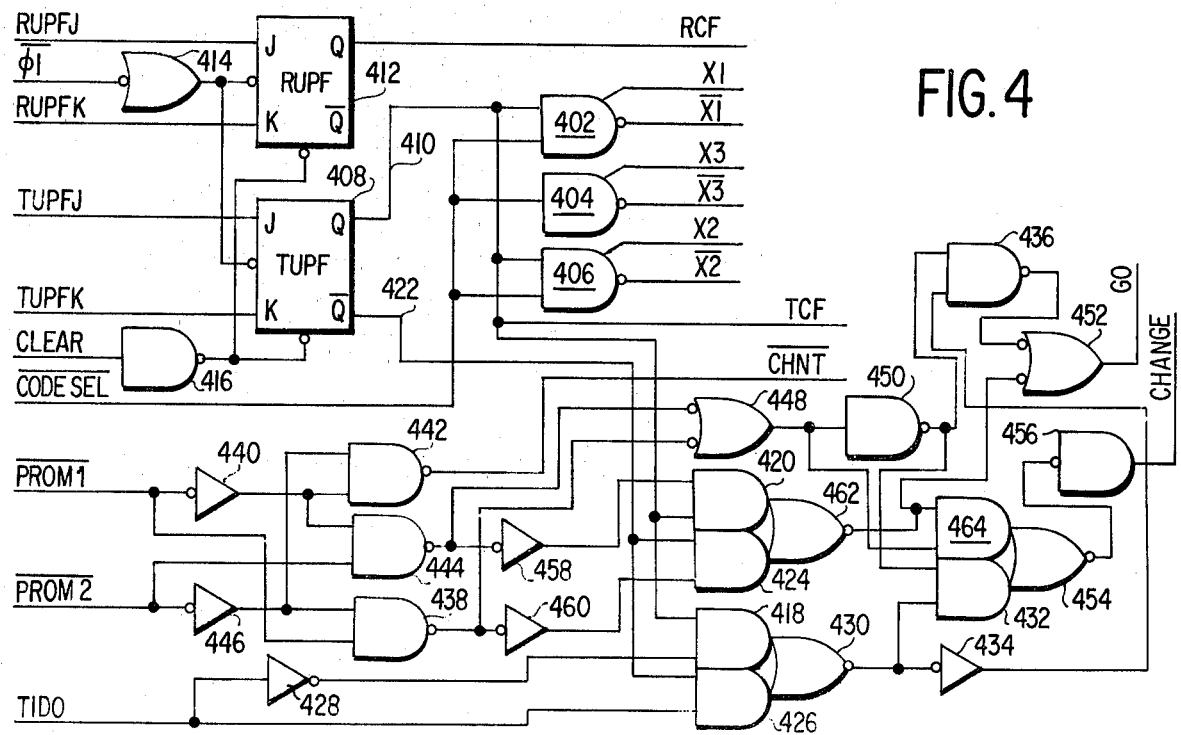
FIG. 4 is a logic diagram showing the circuits for determining when an input character in a first code requires insertion of a second character or when the input character has no equivalent character in a second code; and, FIG. 5 is a logic diagram of the translate control means.

Data Translate Control — FIG. 4

Gates 306-0, 306-1, and 306-5 are actually expander gates having expander inputs X1 and X1, X2 and X2, and X3 and X3, respectively. The signals X1, X2 and X3 and their complements are derived from three NAND gates 402, 404, and 406. Each of these NAND gates receives the signal CODE SEL which is at a low level any time the translator is to generate the code representing the upper case character UC or the code representing lower case character LC. The gates 402 and 406 have a second input which is connected to the output of a transmit case flipflop 408. The flipflop 408 is set so that a high level signal appears on the lead 410 when the translator is in the transmitting mode and is to transmit one or more upper case characters.

The expanders 306 have the characteristic that when both the selector input signals NSO and TSO are at a low level then the output of the expander is controlled only by the expander input. Furthermore, the output of the expander will be the complement of its input.

Consider the case where it is desired to generate the code for LC. The signal CODE SEL rises to the high level and conditions an input of each of the NAND gates 402, 404, and 406. However, since we are to generate the lower case character, flipflop 408 is reset and the low level signal on lead 410 blocks gates 402 and 406. Therefore, gates 402 and 406 produce low level output signals X1 and X2 while the gate 404 produces a high level output signal X3. The low level signal X1 is inverted by expander 306-0 so a logical one appears on the lead OD0. In like manner, the low level signal X2 is inverted by expander 306-1 so a logical one appears on the lead OD1. The high level signal X3 is inverted by gate 306-5 so that a logical zero appears on output lead OD5. With both of the selector signals NSO and TSO at a low level, gates 306-2, 306-3, and 306-4 all produce logical one level signals on leads OD2, OD3, and OD4. Thus, the lower case character code 111110 is generated on the leads OD0 through OD5.

When the upper case character UC is to be generated the high level signal CODE SEL conditions one input of each of the gates 402, 404 and 406. Since this is to be the upper case flipflop 408 is set and the high level signal on the lead 410 conditions the second input of gates 402 and 406. The gates produce the three high level signals X1, X2 and X3 which are inverted by the gates 306-0, 306-1, and 306-5, respectively, so that logical zeros appear on leads OD0, OD1, and OD5. Since both of the select signals NSO and TSO are at the low level, high level logical one signals appear on leads OD2, OD3 and OD4. Therefore, the code generated on lead OD0 through OD5 to represent the upper case character LC is 001110.

In addition to the transmit case flag flipflop 408, FIG. 4 includes a receive mode case flag or flipflop 412. Flipflop 412 is set by the signal RUPFJ and is reset by the RUPFK, both of these signals being generated in FIG. 5 as subsequently explained. The set and reset signals are clocked by the timing signal $\phi1$ which which is inverted by NOR gate 414 before being applied to the clocking input of flipflop 412. When the flipflop 412 is set by the signal RUPFJ is produces the high level signal RCF indicating that the translator should translate the character codes received over bus 114 as codes representing upper case characters. The flipflop 412 may be cleared by a master reset signal designated CLEAR. The CLEAR signal is inverted by NAND 416 before being applied to the reset input terminal of the flipflop. Both the signal CLEAR and the timing signal $\phi1$ are derived from the local word processor. The $\phi1$ signal is a 500 millisecond signal occurring at a 480 kilohertz rate.

The transmit case flipflop 408 is also cleared by the output from NAND 416 and is clocked by the $\phi1$ output of NOR 414. The set and reset signals TUPFJ and TUPFK for flipflop 408 are derived from the FIG. 5 as subsequently explained.

The lower portion of FIG. 4 shows the logic involved in determining whether or not a character appearing on bus 118 is of the same case as that for which the translator is set to transmit. If the comparison indicates that the case of the character is the same as that for which the translator is set to transmit then the circuit of FIG. 4 generates the signal GO which is applied to FIG. 5 to cause the translated character to be transmitted. On the other hand, if the comparison indicates that the case of the character appearing on bus 118 is different from the case for which the translator is set to transmit, then the circuit of FIG. 4 produces the signal CHANGE which is applied through FIG. 5 back to flipflop 408 to change the state of the flipflop and cause the generation of the upper case character UC or the lower case character LC. After generation of the character LC or UC the circuit of FIG. 4 will produce the GO go therby causing the translated character to be transmitted.

There are two separate comparisons performed in FIG. 4 depending upon whether the character to be transmitted is a regular character or a functional character such as carriage return, tab, set tab, etc.

For the regular or non-function characters a comparison is made between the state of flipflop 408, which indicates whether the translator is set for transmitting upper or lower case characters, and the signal TID0 which is the least significant bit of the character on bus 118 and represents the case of the character. The set output of flipflop 408 is connected by way of lead 410 to one input of a NAND 418 and the reset output of the flipflop is connected by a lead 422 to one input of a NAND 426. The signal TID0 is applied directly to NAND 426 and is passed through an inverter 428 and applied to NAND 418. The outputs of NANDS 418 and 426 are applied to an OR gate 430. The output of the OR gate is applied directly to one input of a NAND 432 and is passed through an inverter 434 and applied to one input of a NAND 436. The output of NAND 436 is connected to a NOR gate 452 and the output of NOR 452 is the signal GO. The output of NAND 432 is passed through an OR gate 454 and a NAND 456 to become the high level signal CHANGE.

If flipflop 408 is set, indicating that the translator is set for transmitting upper case characters, and if the signal TID0 is low, indicating that the character to be transmitted is an upper case character, both inputs of NAND 418 are conditioned so OR 430 produces a low level output signal to block NAND 432. Inverter 434 inverts the low level signal and conditions one input of gate 436. As subsequently explained, the second input of gate 436 will be at a high level if the character on bus 118 does not represent one of the function codes. Therefore, NAND 436 will produce a low level output signal that is inverted by nor 452 to become the high level signal Go.

If the flipflop 408 is reset, indicating that the translator is set up for translating lower case characters, and if the signal TID0 is at a high level indicating that the character on bus 118 is a lower case character, then NAND 426 causes OR 430 to produce a low level output. As with the preceding comparison, NAND 432 is blocked and NAND 436 is conditioned so that NOR 452 produces the signal GO.

If the transmitting case as represented by flipflop 408 and the character case as determined by TID0 are not the same, then both gates 418 and 426 are blocked and OR 430 produces a high level output signal. If the character on bus 118 does not represent one of the function codes then the second input of NAND 432 will at the high level so that NOR 454 will produce a low level output signal. This signal is inverted by NAND 456 to become the signal CHANGE.

Each storage position in PROM 100 that stores the code for one of the characters in the IBM Correspondence Code also has stored therein two identification bits (ID) which are read out of the memory at the same time the character is read out. These identification bits appear on the leads PROM 1 and PROM 2. These identification bits have been assigned according to the following criteria. If the character in the UNIVAC* code which addresses the memory has no equivalent character in the IBM correspondence code, the ID bits are chosen such that the signals PROM 1 and PROM 2 are both low level signals. PROM 1 is inverted by an inverter 440 and applied to one input of a NAND 442 while the signal PROM 2 is inverted by an inverter 446 and applied to the second input of NAND 442. If PROM 1 and PROM 2 are both at the low level then NAND 442 produces the low level signal CHNT. As explained in connection with FIG. 5, the signal CHNT controls the translator so that the output of the memory is not gated through data selector 104 to the output bus 120.

The ID bits assigned to the various memory positions are further chosen such that PROM 1 and PROM 2 are both high level signals if the position is addressed by a regular (i.e. non-function code) character. As previously stated a comparison is made between the state of flipflop 408 and the signal TID0 if a regular or non-function character is being translated. This requires the enablement of NAND 432 and NAND 436. The signal PROM 2 is applied directly to one input of a NAND 444 and is inverted by inverter 446 and applied to one input of a NAND 438. PROM 1 is applied directly to the second input of NAND 438 and is inverted by inverter 440 and applied to the second input of NAND 444. The output of NANDS 438 and 444 are applied to the two inputs of a NOR 448. The output of NOR 448 is applied through a NAND 450 to NANDS 432 and 436. If PROM 1 and PROM 2 are both at the high level then the outputs from inverters 440 and 446 block NANDS 444 and 438. With of its inputs at a high level NOR 448 produces a low level output signal that is inverted by NAND 450 to enable NANDS 432 and 436. This enables the GO or CHANGE signals to be generated as a result of the comparison by gates 418 and 426 of the state of flipflop 408 and the signal TID0.

The ID bits assigned to those memory locations that are addressed by characters representing function codes are chosen such that one of the signals PROM 1 and PROM 2 is at a low level and the other is at a high level. If the function code is considered upper case then the signal PROM 1 is the low level signal. If the function code is considered to be lower case then PROM 2 is the low level signal.

As previously explained, the comparison made by gates 418 and 426 is effectively blocked at gates 432 and 436 when the character being translated is a function code. Furthermore, a comparison must be made between the case of the translator as indicated by the state of flipflop 408 and the case of the function code as determined by the ID bits. If one but not both of the signals PROM 1 and PROM 2 is at a low level, one of the gates 438 and 444 produces a low level output signal that is inverted by NOR 448, and inverted again by NAND 450 to block the gates 432 and 436. The comparison of PROM 1 and PROM 2 with the state of flipflop 408 is accomplished by two NAND gates 420 and 424. The output of NAND 444 is inverted by an inverter 458 and applied to one input of NAND 420 so as to enable the gate if PROM 1 is at a low level and PROM 2 is at a high level thereby indicating an upper case function code. The output of NAND 438 is inverted by an inverter 460 and applied to one input of a NAND 424 to enable NAND 424 if PROM 1 is at a high level and PROM 2 is at a low level thereby indicating that the function code is lower case. The set output of flipflop 408 is connected by lead 410 to the second input of NAND 420 whereas the reset output of the flipflop is connected by lead 420 to the second input of NAND 424. NANDS 420 and 424 are connected to inputs of an OR 462 and the output of OR 462 is connected to one input of a NAND 464 and one input of NOR 452. If the function code is lower case and flipflop 408 is reset NAND 424 produces a low level output signal that is inverted by NOR 452 to become the signal GO. On the other hand, if flipflop 408 is set and the function code is upper case then NAND 420 produces an output signal to generate the signal GO.

If the case mode of the translator as represented by flipflop 408 does not agree with the case of the function code as represented by the outputs of inverters 458 and 460, both gates 420 and 424 are blocked and OR 462 produces a high level signal that conditions one input of NAND 464. Since this is a function code one of the NANDS 438 and 444 must produce a low level output signal that is inverted by NOR 448 and applied as a second input to NAND 464. The resulting low level output from OR 454 is inverted by NAND 456 to become the signal CHANGE.

Figure 5A:
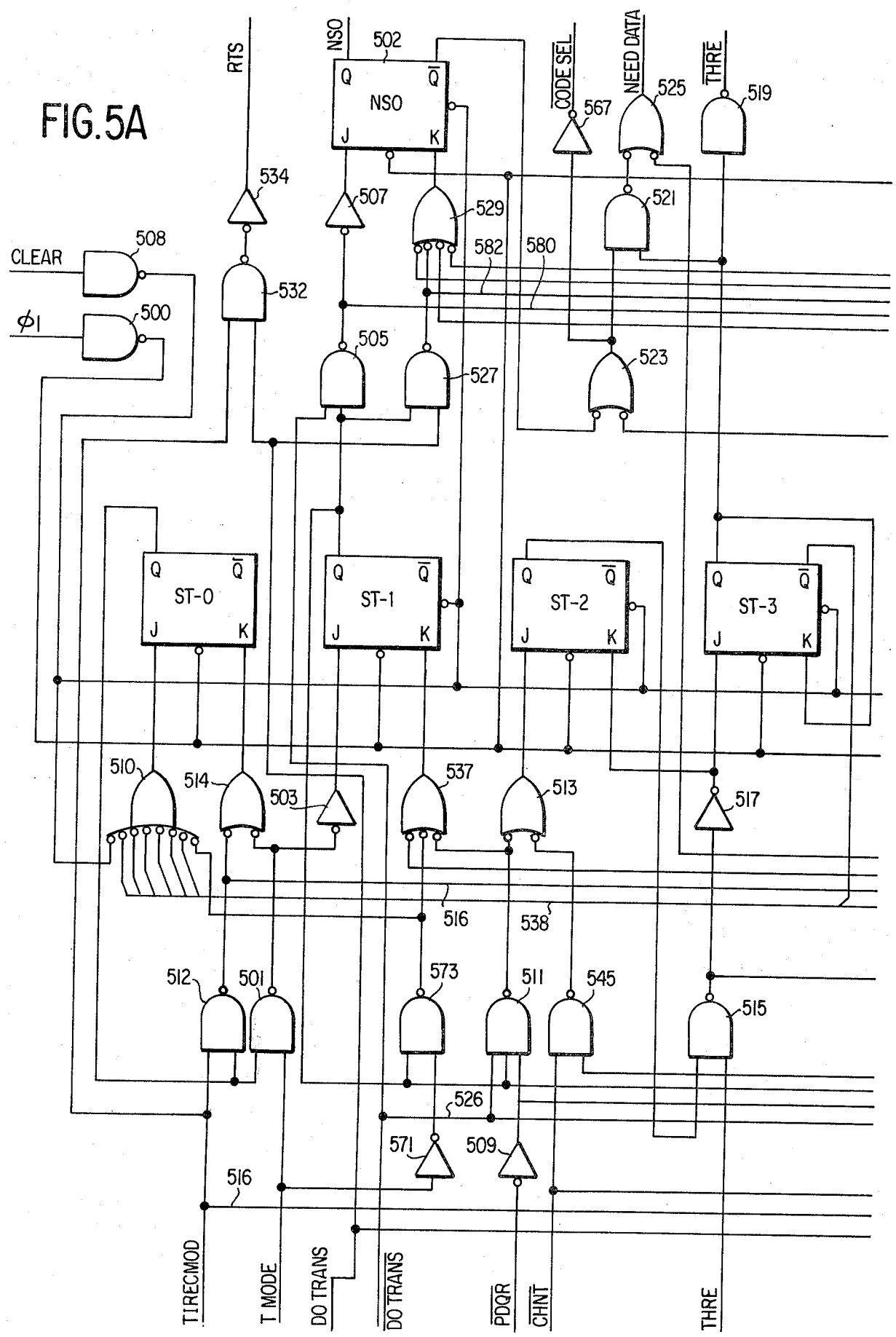
Figure 5B:
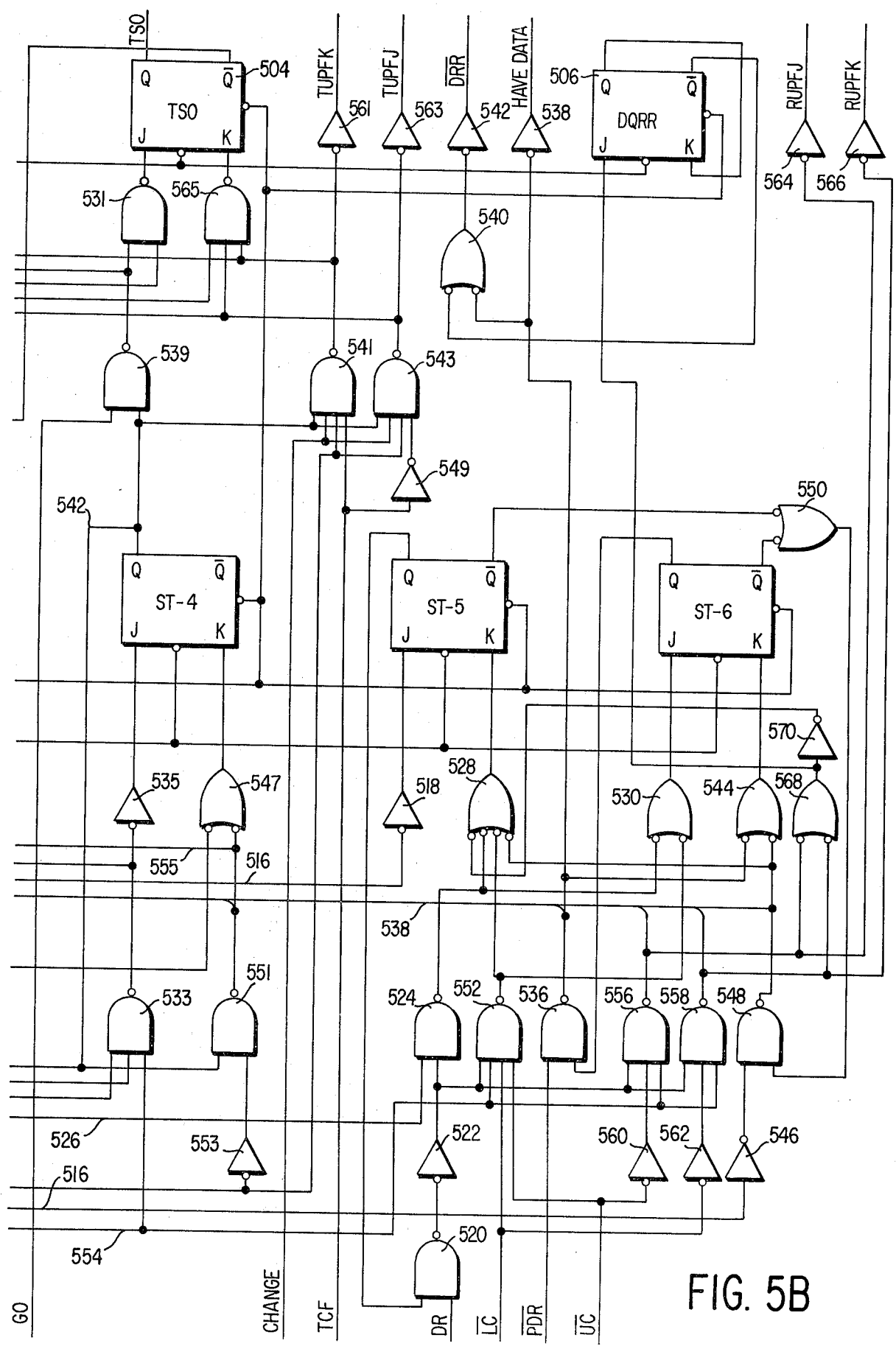

The Control Translator — FIGS. 5A and 5B

The details of the control translator 112 are shown in FIGS. 5A and 5B. The control translator is a sequential controller having seven states, each state being represented by the set condition of one of seven flipflops ST-0 through ST-6. The clock signal $\phi 1$ is inverted by a NAND 500 and applied to the clock inputs of flipflops ST-0 through ST-6 as well as the clocking inputs of three further flipflops 502, 504, and 506. The master reset or CLEAR signal is inverted by a NAND 508 and applied to the master reset inputs of all of the flipflops except ST-0. The output of NAND 508 is applied to one input of a NOR 510 and the output of NOR 510 is applied to the J input of ST-0. Therefore, upon occurrence of the signal CLEAR all of the flipflops in FIGS. 5A and 5B are reset except ST-0 which is set.

State 0 is an idle state and represents the condition where the translator is not in either the receive or the transmit mode. States 1 through 3 come into play when the translator is in the transmit mode and states 5 and 6 come into play when the translator is operating in the receive mode. State 4 is employed to determine if an upper case or a lower case correspondence code character is to be inserted into the outgoing stream of characters while the translator is operating in the transmit mode. The detailed operation of the control translator may best be explained by considering separately its four modes of operation.

Receive Non-Translate Mode

The controller may be changed from the idle mode to the receive mode by the signal T1RECMOD. This signal is generated by the local word processor and is applied to one input of a NAND 512. If ST-0 is set NAND 512 produces an output signal that passes through a NOR 514 to the K input of the idle mode flipflop ST-0. Upon occurrence of the next $\phi 1$ signal the flipflop is reset thereby taking the controller out of the idle mode. The output of NAND 512 is also applied over a lead 512 and through an inverter 518 to the J input of ST-5 so that ST-5 is set by the same clock signal that resets ST-0. The controller waits in state 5 until the I/O Modem generates the signal DR indicating that the I/O Modem has a character ready to be transferred to the translator. The signal DR is applied to one input of a NAND 520 which is further conditioned by the set output of ST-5. The output of NAND 520 is inverted by an inverter 522 and applied to one input of a NAND 524.

Assuming that the local word processor is set up to receive data without translation it causes the high level signal DO TRANS to be applied to the control translator. The signal enters FIG. 5A and is applied over a lead 526 to a second input of NAND 524. Therefore, upon occurrence of the signal DR NAND 524 produces an output signal that is applied through a NOR 528 to the reset input of ST-5. The output of NAND 524 is also applied through a NOR 530 to the set input of ST-6. Upon occurrence of the next φ1 ST-5 is reset and ST-6 is set.

When the controller enters state 6 the output of ST-6 enables one input of a NAND 536. NAND 536 is further enabled by the signal PDR which is applied to the controller from the word processor interface circuit when the interface circuit is ready to accept data from the translator.

The controller waits in state 6 until the signal PDR goes to the high level at which time the output of NAND 536 passes through an inverter 538 to become the signal HAVE DATA. This signal is applied to the word processor interface circuit to inform the interface circuit that the translator has a character ready to output to the interface circuit. The interface circuit responds to the signal have data by dropping the signal PDR to the low level while the character is being processed.

At the time the signal HAVE DATA is sent to the interface circuit the output of NAND 536 is passed through a NOR 540 and an inverter 542 to become the low level signal DRR. This signal is applied to the I/O Modem causing the I/O Modem to terminate the signal DR and the character on the bus 114. At the same time, the output of NAND 536 is applied through a NOR 544 to the K input of ST-6. Furthermore, the output of NAND 536 is applied over a lead in a cable 538, and through the NOR 510 to the J input ST-0. Upon occurrence of the next φ1 ST-6 is reset and ST-0 is set thereby returning the controller to the idle mode.

The controller does not remain in the idle mode if the signal T1RECMOD has remained at a high level. The output of NAND 512 passes through NOR 514 to condition the reset input of ST-0 so that ST-0 is reset at the next φ1. At the same time, the output of NAND 512 passes over lead 516 to set ST-5. The controller again waits in state 5 until the I/O Modem again produces the high level signal DR. Another cycle of state 5 and 6 is repeated as previously described and this sequence continues as long as T1RECMOD remains at a high level.

If T1RECMOD should drop to the low level the receive mode is immediately terminated and the controller is returned to the idle mode. The signal T1RECMOD is applied over the lead 516 and through an inverter 546 to condition one input of a NAND 548. The reset outputs of ST-5 and ST-6 are applied through a NOR 550 to a second input of NAND 548. When T1RECMOD drops to the low level NAND 548 produces an output signal that is applied through NOR 544 to the K input of ST-6, through NOR 528 to the K input of ST-5, and over a lead in cable 538 and through NOR 510 to the J input of ST-0. Upon occurrence of the next φ1 ST-5 and ST-6 are reset while ST-0 is set. The low level signal T1RECMOD block NAND 512 so that in this situation the receive mode cannot be continued.

The controller generates the low level signal RTS all the time the translator is in a receive mode. The low level signal DO TRANS, derived from the local word processor, blocks a NAND 532. The high level output of NAND 532 passed through an inverter 534 so that the signal RTS is at a low level during the receive mode. The signal RTS blocks gates 202 and enables gates 220 so that the characters on bus 114 is gated through data selector 106 to bus 116.

Receive Translate Mode

The operation of the controller in the receive mode with translation is essentially the same as the receive mode described above without translation provided that a received character is not UC or LC indicating a required transition from one case to the other. One difference is that the signal DO TRANS is at a high level. This conditions NAND 532 to produce a low level output signal so that the signal RTS is driven to the high level. In FIG. 2, the signal RTS conditions the gates 202 and 222 so that the data on the bus 114 passes through data selector 102 to address PROM 100, and the translated output from PROM 100 is passed through data selector 106 to the bus 116. In addition, RTS is applied to PROM 100 as an address signal as previously described.

In the receive translate mode the output of NAND 512 resets ST-0 and sets ST-5 in the same manner as for the non-translate mode. However, the resetting of ST-5 and the setting of ST-6 is controlled by a NAND 552 which has its output connected to NOR 528 for resetting ST-5 and to NOR 530 for setting ST-6. The high level signal DO TRANS is applied over a lead 554 the one input of NAND 552. NAND 552 also receives the output of inverter 522 as well as the signals LC and UC derived from the case select circuit of FIG. 2. Therefore, NAND 552 produces an output signal to reset ST-5 and set ST-6 each time the I/O Modem produces the signal DR provided that the character the I/O Modem has placed on bus 114 is not one of the case characters LC or UC. The controller then proceeds through state 6 and back to state 0 in the same manner as previously described for the non-translating receive mode.

If the translator is operating in the receive translate mode it does not proceed through state 6 but instead returns from state 5 to state 0 is one of the case characters LC or UC is placed on the bus 114. The word processor interface circuit is not informed that the translator has data on bus 116 but the I/O Modem is requested to place on bus 114 the character following the case character. This is accomplished as follows.

ST-0 is reset and ST-5 is set as described above for the receive translate mode. However, when the I/O Modem generates the signal DR to indicate that it has placed data on bus 114 the output of inverter 522 cannot pass through NAND 552 because the case character on bus 114 will have driven one of the signals LC or UC to the low level. However, the output of inverter 522 is also applied as an input to two NAND gates 556 and 558. These gates are both enabled by the signal DO TRANS on lead 554. The signal UC is applied through an inverter 560 to an input of NAND 556 whereas the signal LC is applied through an inverter 562 to an input of NAND 558. Therefore, one of the gates 556 or 558 will produce a low level output signal at the time the I/O Modem generates the signal DR if there is a case character on the bus 114.

The outputs of NANDS 556 and 558 are applied through bus 538 and NOR 510 to the J input of ST-0 so that the control returns to the idle state upon occurrence of the next φ1. The outputs of gates 556 and 558 are passed through inverters 564 and 566 to become the signals RUPFJ and RUPFK, respectively. These signals are applied to the set and reset inputs of the receive case flipflop 412 so that the state of the flipflop is changed at the next φ1 to agree with the case of the character LC or UC that appeared on bus 114.

The outputs of NAND 556 and NAND 558 are also applied to a NOR 568. The output of NOR 568 is applied through an inverter 570 and NOR 528 to reset ST-5 at the next φ1. The output of NOR 568 is also applied to the J input of the flipflop 506 so that this flipflop is set at the same time ST-5 is reset and ST-0 is set. The set output of flipflop 506 is applied to its K input so that it resets itself at the next φ1 after it is set.

While flipflop 506 is set it produces an output signal that passes through NOR 540 and inverter 542 to become the signal DRR thereby requesting the I/O Modem to place the next character on bus 114. The controller then continues its normal sequence ST-0, ST-5, ST-6 until another case character is sensed on bus 114 or until the receive mode signal T1RECMOD is terminated.

Transmit Non-Translate Mode.

If the controller is in the idle mode it may be switched to the transmit translate or the transmit non-translate mode. For the transmit non-translate mode the signals T MODE and DO TRANS applied to the translator from the local word processor are both at the high level. The signal T1RECMOD is at the low level and blocks NAND 532 so that the signal RTS is at the low level. This gates characters on bus 118 to the addressing inputs of PROM 100, blocks gates 222 in data selector 106 so that the output from the memory cannot reach output bus 116.

The signal T MODE is applied to a NAND 501 and if the controller is in the idle mode NAND 501 is further conditioned by the output of ST-0. NAND 501 produces an output signal that passes through NOR 514 to reset ST-0 at the next φ1. The output of NAND 501 is applied through an inverter 503 to the J input of ST-1 so that the controller enters stage 1 at the same time the idle mode is terminated. The set output of ST-1 is applied to one input of a NAND 505 which receives as its second input the high level signal DO TRANS. The output of NAND 505 is passed through an inverter 507 and applied to the J input of the Normal Select Out flipflop 502. On the first φ1 following the setting of ST-1, flipflop 502 is set and the signal NSO rises to the high level. This signal is applied to the data selector 104 where it enables the gates 302 so that any characters appearing on bus 118 may pass directly through the data selector to the output bus 120.

The output of NAND 505 is also applied over a lead 580 to a NAND 565 which has an output connected to the K input of flipflop 504. The low level output of NAND 505 blocks NAND 565 so that a high level signal is applied to the flipflop. Therefore, flipflop 504 is reset at the same time flipflop 502 is set, thereby assuring that the signal TSO is at a low level. This blocks gates 304 so that no output from the memory may pass through data selector 104 to the bus 120.

The controller waits in stage 1 until the word processor interface circuit has placed a character on the bus 118 and generated the low level signal PDQR. The signal PDQR is applied through an inverter 509 to one input of a NAND 511. NAND 511 is further conditioned by the high level signal DO TRANS and the set state of ST-1. NAND 511 produces an output signal that passes through a NOR 513 to the J input of ST-2. ST-2 is thus set at the next φ1, which is the same time at which flipflop 502 is set.

The set output of ST-2 is connected to one input of a NAND 515. This NAND is further conditioned by the signal THRE which is provided by the I/O Modem when the holding register therein is empty and ready to receive data from the translator over the bus 120. The output of NAND 515 is passed through an inverter 517 and applied to the K input of ST-2 and the J input of ST-3. On the next occurring φ1 ST-2 is reset and ST-3 is set.

The set output of ST-3 is inverted by a NAND 519 to become the signal THRL. This signal is applied to the I/O Modem to strobe the data on bus 120 into the holding register in the I/O Modem. The set output of ST-3 is also applied to one input of a NAND 521. The reset output of flipflop 502 is applied through a NOR 523 to the second input of NAND 521. The output of NAND 521 passes through a NOR 525 to become the signal NEED DATA. This signal is applied to the local word processor interface circuit to tell the interface circuit that another character should be placed on the bus 118.

The reset output of ST-3 passes over a lead in bus 538 and through NOR 510 to the J input of ST-0. The set output of ST-3 is applied to the K input of ST-3. Therefore, on the first φ1 following the setting of ST-3, ST-0 is set and ST-3 is reset. This completes the cycle for transmitting one character in the non-translating mode. It is repeated for succeeding characters as long as the signal T mode remains at the high level.

Transmit Translate Mode

The operation of the controller in the transmitting mode with translation may vary from character to character depending upon whether or not the character placed on bus 118 is of the same or the opposite case from the character that preceded it. Furthermore, the operation of the controller may have a third variation depending upon whether or not the character placed on bus 118 is a non-transmittable character. As in the transmit non-translate mode, the signal T1RECMOD is at a low level and the signal RTS permits characters on bus 118 to address PROM 100 while the outputs from PROM 100 are blocked at data selector 106 so that they cannot reach bus 116.

Assume first the situation where the character placed on bus 118 is a transmittable character of the same case as the character which preceded it. Assuming that the controller has returned to the idle state and the signals T MODE and DO TRANS are high, the output of NAND 501 passes through NOR 514 and inverter 503 to the K input of ST-0 and the J input of ST-1. At φ1 ST-0 is reset and ST-1 is set. The output of ST-1 is applied to one input of a NAND 527. The signal DO TRANS from the local word processor is at a high level so NAND 527 produces a low level output signal. This signal is inverted by a NOR 529 and conditions the K input to flipflop 502. The low level output from NAND 527 is applied over a lead 582 to block a NAND 531 so that a high level signal is applied to the J input of flipflop 504. Therefore, at the same time the controller enters state 1, flipflop 502 is reset and flipflop 504 is set. Flipflop 504 produces the signal TSO which is applied to the data selector 104 where it conditions the gates 304 so that the translated character from PROM 100 may be read through the data selector to the output bus 120. At the same time, the signal NSO blocks gates 302 so that the character on bus 118 cannot pass through the data selector.

The controller remains in state 1 until the word processor interface circuit places the character on bus 118 and generates the low level signal PDQR. This signal is passed through the inverter 509 and applied to one input of a NAND 533. NAND 533 is further conditioned at this time by the set output of ST-1 and the signal DO TRANS. The output of NAND 533 is applied through an inverter 535 to the J input of ST-4 and through a NOR 537 to the K input of ST-1. At the next $\phi1$ ST-1 is reset and ST-4 is set.

The case of the character on data bus 118 is compared with the case of the translator as represented by the state of flipflop 408 as previously described. Since for the assumed situation the two cases are the same the circuit of FIG. 4 is producing the signal GO. In FIG. 5b the signal GO is applied to one input of a NAND 539. This gate is also conditioned by the set output of ST-4. The output of NAND 539 blocks NAND 531 which would otherwise be unblocked by the signal from NAND 527 when ST-1 is reset. This insures that flipflop 504 remains set when the next $\phi1$ occurs. The output of NAND 539 is applied through NOR 529 to the K input of flipflop 502 thus insuring that this flipflop remains reset.

The set output of ST-4 is connected by lead 542 to one input of a NAND 545. Since it is assumed that the character on bus 118 is a transmittable character, the circuit of FIG. 4 is producing the high level signal CHNT and this signal is applied to a second input of NAND 545. The output of NAND 545 is applied through the NOR 513 to the J input of ST-2 and through a NOR 547 to the K input of ST-4. Therefore, on the first $\phi1$ after ST-4 is set, ST-2 is set and ST-4 is reset.

Once the controller reaches stage 2 it proceeds through stage 3 and back to idle stage 0 in the same manner as when transmitting in the non-translating mode. That is, the controller waits in stage 2 and then stage 3 is set when the I/O Modem emits the signal THRE indicating that it is ready to receive a character. While in stage 3 it emits the signal THRL to strobe the date on bus 120 into the I/O Modem, and emits the signal NEED DATA to signal the local word processor interface circuit to place another character on the bus 118.

When the controller is operating in the translate transmit mode, there is no need to proceed through stages 2 and 3 if the character on bus 118 is not to be transmitted. The controller proceeds from stage 0 through stage 1 to stage 4 as with the immediately preceding description. However, under the assumed conditions the signals GO, CHANGE, and CHNT produced by FIG. 4 are all at the low level. The signal GO blocks NAND 539. This insures that both inputs of NAND 531 are conditioned and the J input of flipflop 504 is at the low level. Also, the output of NAND 539 in combination with the outputs of NANDS 527, 541 and 543 drives the K input of flipflop 502 to the low level. NANDS 541 and 543 are blocked by the signal CHANGE. The outputs from NANDS 541 and 543 in combination with the high level output from NAND 505 enable NAND 565 so that the K input of flipflop 504 remains at the low level. With their J and K inputs both at a low level, the states of the flipflops 502 and 504 cannot change at the next $\phi1$.

The output of ST-4 is applied over lead 541 to one input of NAND 551. The low level signal CHNT is passed through an inverter 553 and conditions the second input of NAND 551. The NAND produces an output signal that is applied through NOR 547 to the K input of ST-4. The output of NAND 551 also passes over bus 538 and through NOR 510 to the J input of ST-0. The output of NAND 551 is also applied over a lead 555 to NOR 525 thereby generating the signal NEED DATA. This requests the local word processor interface circuit to replace the non-transmittable character on bus 118 with the next character. The enabling inputs to ST-0 and ST-4 remain until the next $\phi1$ at which time the output from NAND 551 resets ST-4 and sets ST-0. This completes the cycle for the non-transmittable character. During the cycle the controller has requested a new character without signalling the I/O Modem to accept the non-transmittable character.

In the transmit translate mode, if the case of the character on bus 118 is different from the case of the translator circuit as determined by flipflop 408, then an appropriate case character LC or UC must be generated and transmitted before the character on bus 118 is transmitted. The controller proceeds from stage 0 through stage 1 to stage 4 as in the immediately preceding example. Upon reaching state 4 the output of ST-4 conditions the gates 541 and 543. The character on bus 118 has been compared with the state of flipflop 408 and FIG. 4 is producing the high level output signal CHANGE and CHNT and the low level output signal GO. The output signal TCF from FIG. 4 is at a high or a low level depending upon the state of the case flipflop 408. In FIG. 5 the signals CHNT and CHANGE further condition inputs of both NAND gates 541 and 543. The signal TCF conditions the last input of one of the gates but blocks the other gate depending upon whether TCF is high or low.

Assuming flipflop 408 is set then TCF is high and NAND 541 produces a low level output signal that passes through an inverter 561 to become the signal TUPFK. This signal is applied to the K input of flipflop 408 so that upon occurrence of the next $\phi1$ the flipflop will be reset. On the other hand, if flipflop 408 is reset then the signal TCF is at a low level and the output of inverter 549 conditions NAND 543. NAND 543 produces a low level output signal that passes through an inverter 563 to become the signal TUPFJ. This signal is applied to the J input of flipflop 408 so that the flipflop will be reset upon the next occuring $\phi1$.

Regardless of which of the NAND gates 541 or 543 produces a low level output signal, it blocks NAND 565 and passes through NOR 529 to the K input of flipflop 502. Therefore, at the same time that flipflop 408 changes state both flipflops 502 and 504 are reset and the signals TSO and NSO block all outputs from data selector 104. The outputs from the flipflops also drive the output of NOR 523 to the low level and this signal passes through an inverter 567 to become the high level signal CODE SEL. In FIG. 4, CODE SEL samples the three gates 402, 404, and 406 and, depending upon the new state of flipflop 408 applies a combination of the signals X1, X2, and X3 to the data selector of FIG. 3 so as to generate, in combination with the signals NSO and TSO, the code for the upper case character UC or the lower case character LC.

The output of ST-4 is applied over lead 541 to NAND 545 and since the signal CHNT is at a high level the output of NAND 545 passes through NOR 513 to set ST-2. The output of NAND 545 also passes through NOR 547 to the reset input of ST-4. Therefore, at the time flipflops 502 and 504 are reset and the state of flipflop 408 is changed, ST-2 is set and St-4 is reset. If the I/O Modem is ready to receive data the signal THRE in combination with the output of ST-2 enables NAND 515 and the NAND produces an output signal through inverter 517 to enable the reset of ST-2 and the set of ST-3. On the following $\phi 1$ ST-3 is set and its high level output passes through NAND 519 to become the signal THRL which strobes the case character on bus 120 into the holding register of the I/O Modem. It should be noted that during this interval the character on bus 118 which forced the generation of the case character has remained present on bus 118. Therefore, even though the output of ST-3 enables one input of NAND 521 the other input of the NAND gate is blocked because flipflops 502 and 504 are both still in the reset state. Therefore the signal NEED DATA is not generated and applied to the local word processor interface circuit because there is still a character on bus 118 that must be translated.

The set output of ST-3 enables the reset input of ST-3 and the reset output of ST-3 passes over cable 538 and through NOR 510 to enable the J input of ST-0. On the $\phi 1$ after ST-3 is set, it is reset and ST-0 is set. The controller is now ready to go through another cycle during which it will cause the character that has been held on bus 118 to be translated and applied to the bus 120. The controller proceeds from state 0 to state 1 as previously described for the transmit translate mode where the cases agree, and when it reaches state 1 NAND 527 produces a low level output signal that is inverted at NAND 531 to condition the J input flipflop 504. Therefore, the flipflop is set by the $\phi 1$ clock at the same time the controller changes from state 1 to state 4. When the controller reaches state 4 it finds that the conditions are different than when it last reached that state. Since the flipflop 408 has had its state changed, the circuit of FIG. 4 is producing the high level signal GO while the signal CHANGE is at a low level. The CHANGE signal blocks NANDS 541 and 543 while the high level signal GO conditions NAND 539. The outputs of NAND 541 and 543 are applied to NAND 565 which is further conditioned by the high level output from NAND 505 so that a low level signal is applied to the K input of flipflop 504. The low level output from NAND 539 blocks NAND 531 so that a high level signal is applied to the J input of flipflop 504. This insures that on the next $\phi 1$ the flipflop 504 remains in its set state. The output from NAND 539 passing through NOR 529 insures that the flipflop 502 will be held reset at the next $\phi 1$.

From state 4 the controller again proceeds through states 2 and 3 but this time when it reaches state 3 it not only generates the signal THRL to strobe the character on bus 120 into the holding register of the I/O Modem, but also generates the signal NEED DATA to signal the local word processor interface circuit that it should supply a new character on the bus 118. The NEED DATA signal is generated this time because flipflop 504 is set thereby enabling one input of NAND 521 through NOR 523. From state 3 the controller again returns to state 0 and is ready to process the next character.

The controller may be returned to the idle state from state 1 of the transmit translate mode by terminating the signal T MODE. The signal T MODE is applied through an inverter 571 to one input of a NAND 573. The set output of ST-1 is connected to the second input of NAND 573 so that when the signal T MODE drops to the low level NAND 573 produces a low level output signal. This signal is applied through NOR 537 to the reset of ST-1 and through 510 to the set input of ST-0. On the first $\phi 1$ following termination of the signal T MODE, ST-1 is reset and the idle state flipflop ST-0 is set.

Memory Storage And Addressing

As previously explained, PROM 100 includes 256 storage locations each capable of storing eight binary bits. One-half of the addresses (128-255) store eight bit codes representing the various characters of the UNIVAC* code. These addresses are addressed by characters in the IBM Correspondence Code during the receive translate mode. The other half of the addresses (0-127) store six bit codes representing various characters in the IBM Correspondence Code along with two identification bits as previously described. These addresses are addressed by characters in the UNIVAC* code during the transmit translate mode. The receive transmit select signal RTS is applied to PROM 100 as an address bit and determines which half of the memory is addressed by the signals applied thereto through the input data selector 102.

The following Table IV details a preferred arrangement of the data stored in PROM 100. In Table IV, Column 1 identifies a character in the UNIVAC* code. Column 2 shows the address in memory that is addressed by the UNIVAC* character. This address is expressed in two ways, as a decimal value and as a hexadecimal value. Column 3 indicates the character in the IBM Correspondence Code. Column 4 shows the complement of the hexadecimal value stored at the address specified in Column 2 and representing the character in Column 3.

As a specific example of the interpretation of Table IV consider the character $q$ or Q. From Table I, this character in the UNIVAC* code is represented by the code X0010000 where X is the least significant bit and is a zero for Q and a one for $q$. The least significant bit is replaced by the signal RTS which has a zero value during the transmit translate mode. The RTS bit is applied directly to the memory. The seven most significant bits (bits 1 through 7) are gated through data detector 102 to address PROM 100. However, inspection of FIG. 2 shows that in passing through data selector 102 bits are inverted except for bit 3. Therefore the address applied to PROM 100 has the value 01111111. In the hexadecimal system this value is 7F. In response to the addressing character, PROM 100 reads out on its outputs PROM 1 through PROM 8 the hexadecimal value C9. The binary notation of C9 is 11001001. The bits PROM 1 and PROM 2 are identification bits as previously explained so these bits are dropped leaving the six bits 001001. The six bits are inverted as they pass through data selector 104 (see FIG. 3) so that the code produced on bus 120 is 110110. Reference to Table III shows that the code for Q or $q$ is in fact 110110.

The right hand columns of Table IV deal with the addresses 128 through 255 which store the codes representing characters of the UNIVAC* code. Column 5 identifies the characters in the IBM Correspondence Code. Column 6 gives the decimal and equivalent hexadecimal addresses which are accessed by the characters in Column 5. Column 7 shows the corresponding character of the UNIVAC* code stored at each address, and Column 8 gives the code read out of the memory to represent the UNIVAC* character.

Consider for example the translation of the letter $v$ into the UNIVAC* code. From Table III, the code for $v$ is 100011. Although column 5 shows an identification bit ID and a SHIFT bit associated with each IBM Correspondence Code character, these bits are used only for transmission and are blocked at the I/O Modem. Since we are assuming the lower case $v$ is being received there must have been a previous case character LC which reset the receive case mode flipflop 412. Therefore the signal RCF is at the low level and the least significant bit of the address is a zero. The seven bit address applied to data selector 102 (FIG. 2) is thus 0100011 where the leftmost bit is the bit determined by RCF. This address is inverted in passing through data selector 102 so the seven bits as applied to the memory are 1011100. The signal RTS addresses the memory and is considered the leftmost bit. It is at a high level in the receive translate mode hence the full address becomes 11011100. In the hexadecimal code this address is DC and corresponds to the address as given in Column 6 of the Table IV.

In response to the address DC, the memory reads out the complement value 53. In the hexadecimal code this complement value is 01010011. The complement value is applied to data selector 106 and in passing therethrough all bits except bit R2A are again complemented so that the output of data selector 106 is the code 10111100. Since the most significant bit is a zero, reference to table I shows that the code represents the lower case character $v$.

TABLE IV

| | UNIVAC to IBM | | | | IBM to UNIVAC | | | |
|---|---|---|---|---|---|---|---|---|
| | | HEX CHAR. RRRRTTM | | HEX CHAR. | | HEX CHAR. S IH DIBAS421 | | HEX CHAR. LRRRRTTM |
| UNIVAC CHAR. | | 0122512S A  B | IBM CHAR. | DIBA8421 DD | IBM CHAR. | F  T | UNIVAC CHAR. | S122512S B A B |
| q OR Q | | 127  7F | q OR Q | C9 | SPACE | 255  FF | SPACE | 47 |
| A OR Q | | 126  7E | NONE | 00 | ] | 254  FE | ] | 11 |
| K OR K | | 125  7D | k OR K | E9 | 2 | 253  FD | 2 | 59 |
| k OR K | | 124  7C | NONE | 00 | 3 | 252  FC | 3 | 51 |
| i OR I | | 123  7B | i OR I | D9 | 5 | 251  FB | 5 | 39 |
| I OR I | | 122  7A | NONE | 00 | 7 | 250  FA | 7 | 31 |
| 6 OR ¢ | | 121  79 | 6 OR | F9 | 6 | 249  F9 | 6 | 79 |
| 6/OR ¢ | | 120  78 | NONE | 00 | 8 | 248  F8 | 8 | 71 |
| , OR . | | 119  77 | , OR , | C8 | 4 | 247  F7 | 4 | 21 |
| / OR / | | 118  76 | NONE | 00 | 0 | 246  F6 | 0 | 29 |
| c OR C | | 117  75 | c OR C | E8 | z | 245  F5 | z | 19 |
| ¢ OR ¢ | | 116  74 | NONE | 00 | 9 | 244  F4 | 9 | 69 |
| a OR A | | 115  73 | a OR A | D8 | SUB SCRIPT | 243  F3 | | 30 |
| A OR A | | 114  72 | NONE | 00 | SUB SCRIPT | 242  F2 | | 30 |
| 8 OR * | | 113  71 | 8 OR * | F8 | UC | 241  F1 | UC | 0D |
| 8 OR * | | 112  70 | NONE | 00 | C | 240  F0 | C | 0F |
| — OR _ | | 111  6F | — OR _ | C4 | t | 239  EF | t | 1D |
| / OR / | | 110  6E | — | 44 | x | 238  EE | x | 15 |
| b OR B | | 109  6D | b OR B | E4 | n | 237  ED | n | 5D |
| b OR B | | 108  6C | NONE | 00 | u | 236  EC | u | 55 |
| w OR W | | 107  6B | w OR W | D4 | e | 235  EB | e | 3D |
| W OR W | | 106  6A | NONE | 00 | 5 | 234  EA | d | 35 |
| 9 OR ( | | 105  69 | 9 OR ( | F4 | k | 233  E9 | k | 7D |
| 9 OR / | | 104  68 | NONE | 00 | c | 232  E8 | c | 75 |
| NONE | | 103  67 | NONE | 00 | l | 231  E7 | l | 25 |
| NONE | | 102  66 | NONE | 00 | h | 230  E6 | h | 2D |
| NONE | | 101  65 | NONE | 00 | STOP | 229  E5 | | 30 |
| NONE | | 100  64 | NONE | 00 | b | 228  E4 | b | 6D |
| NONE | | 99  63 | NONE | 00 | NONE | 227  E3 | IDLE | 03 |
| NONE | | 98  62 | NONE | 00 | INDEX | 226  E2 | INDEX | 01 |
| NONE | | 97  61 | NONE | 00 | NONE | 225  E1 | IDLE | 03 |
| NONE | | 96  60 | NONE | 00 | NONE | 224  E0 | IDLE | 03 |
| = OR + | | 95  5F | = OR + | CD | ½ | 223  DF | ½ | 1B |
| ≠ OR ≠ | | 94  5E | NONE | 00 | m | 222  DE | m | 1B |
| n OR N | | 93  5D | n OR N | ED | . | 221  DD | . | 5B |
| N OR N | | 92  5C | NONE | 00 | v | 220  DC | v | 53 |
| . OR . | | 91  5B | . OR . | DD | ' | 219  DB | ' | 3B |
| / OR / | | 90  5A | NONE | 00 | r | 218  DA | r | 33 |
| 2 OR @ | | 89  59 | 2 OR @ | FD | i | 217  D9 | i | 7B |
| 2 OR @ | | 88  58 | NONE | 00 | a | 216  D8 | a | 73 |
| f OR F | | 87  57 | f OR F | CC | o | 215  D7 | o | 23 |
| F OR F | | 86  56 | NONE | 00 | s | 214  D6 | s | 2B |
| u OR U | | 85  55 | u OR U | EC | REQ. HYPHEN | 213  D5 | REQ. HYPHEN | 6E |
| U OR U | | 84  54 | NONE | 00 | w | 212  D4 | W | 6B |
| v OR V | | 83  53 | v OR V | DC | TRACK LINK | 211  D3 | ¥ | 78 |
| V OR V | | 82  52 | NONE | 00 | CR | 210  D2 | CR | 41 |
| 3 OR # | | 81  51 | 3 OR # | FC | BKSP | 209  D1 | BKSP | 4B |
| 3 OR # | | 80  50 | NONE | 00 | IDLE | 208  D0 | IDLE | 03 |
| SET TAB | | 79  4F | NONE | 00 | j | 207  CF | j | 1F |
| NONE | | 78  4E | NONE | 00 | g | 206  CE | g | 17 |
| TAB | | 77  4D | TAB | 42 | = | 205  CD | = | 5F |
| REQ. TAB | | 76  4C | REQ. TAB | 82 | f | 204  CC | f | 57 |
| BKSP | | 75  4B | BKSP | 51 | p | 203  CB | p | 3F |
| REQ. BKSP | | 74  4A | REQ. BKSP | 91 | ; | 202  CA | ; | 37 |
| SCR | | 73  49 | CR | 52 | q | 201  C9 | q | 7F |
| REQ. SCR | | 72  48 | REQ. SCR | 92 | , | 200  C8 | , | 77 |
| SPACE | | 71  47 | SPACE | 7F | / | 199  C7 | / | 27 |
| REQ SPACE | | 70  46 | REQ. SPACE | BF | y | 198  C6 | y | 2F |

TABLE IV-continued

| | UNIVAC to IBM | | | | IBM to UNIVAC | | |
|---|---|---|---|---|---|---|---|
| UNIVAC CHAR. | HEX CHAR. RRRRTTM 0122512S A   B | IBM CHAR. | HEX CHAR. DIBA8421 DD | IBM CHAR. | HEX CHAR. S IH DIBA8421 F   T | UNIVAC CHAR. | HEX CHAR. LRRRRTTM S122512S B A B |
| NONE | 69 45 | NONE | 00 | NONE | 197 C5 | IDLE | 03 |
| NONE | 68 44 | NONE | 00 | — | 196 C4 | — | 6F |
| NONE | 67 43 | NONE | 00 | REQ. SPACE | 195 C3 | REQ. SPACE | 46 |
| CLEAR TAB | 66 42 | NONE | 00 | TAB | 194 C2 | TAB | 4D |
| CR | 65 41 | CR | 52 | LC | 193 C1 | LC | 05 |
| REQ. CR | 64 40 | REQ. CR | 92 | NONE | 192 C0 | IDLE | 02 |
| p OR P | 63 3F | p OR P | CB | REQ. SPACE | 191 BF | REQ. SPACE | 46 |
| ⌐ OR ⌐ | 62 3E | NONE | 00 | [ | 190 BE | [ | 91 |
| e OR E | 61 3D | e OR E | EB | @ | 189 BD | @ | D9 |
| ⌐ OR ⌐ | 60 3C | NONE | 00 | # | 188 BC | # | D1 |
| ' OR " | 59 3B | ' OR " | DB | % | 187 BB | % | B9 |
| ⌐ OR ⌐ | 58 3A | NONE | 00 | & | 186 BA | & | B1 |
| 5 OR % | 57 39 | 5 OR % | FB | | 185 B9 | | F9 |
| ⌐ OR ⌐ | 56 38 | REQ. CR | 92 | * | 184 B8 | * | F] |
| ; OR : | 55 37 | ; OR : | CA | $ | 183 B7 | $ | A] |
| ⌐ OR ⌐ | 54 36 | NONE | 00 | ) | 182 B6 | ) | A9 |
| d OR D | 53 35 | d OR D | EA | Z | 181 B5 | Z | 99 |
| ⌐ OR ⌐ | 52 34 | NONE | 00 | ( | 180 B4 | ( | E9 |
| r OR R | 51 33 | r OR R | DA | NONE | 179 B3 | IDLE | 03 |
| ⌐ OR ⌐ | 50 32 | NONE | 00 | NONE | 178 B2 | IDLE | 03 |
| 7 OR % | 49 31 | 7 OR & | FA | UC | 177 B1 | UC | 0D |
| ⌐ OR ⌐ | 48 30 | NONE | 00 | | 176 B0 | | 0F |
| y OR Y | 47 2F | y OR Y | C6 | T | 175 AF | T | 9D |
| ⌐ OR ⌐ | 46 2E | NONE | 00 | X | 174 AE | X | 95 |
| h OR H | 45 2D | h OR H | E6 | N | 173 AD | N | DD |
| ⌐ OR ⌐ | 44 2C | NONE | 00 | U | 172 AC | U | D5 |
| s OR S | 43 2B | s OR S | D6 | E | 171 AB | E | BD |
| ⌐ OR ⌐ | 42 2A | NONE | 00 | D | 170 AA | D | B5 |
| 0 OR ) | 41 29 | 0 OR ) | F6 | K | 169 A9 | K | FD |
| ⌐ OR ⌐ | 40 28 | NONE | 00 | C | 169 A8 | C | F5 |
| / OR ? | 39 27 | / OR ? | C7 | L | 167 A7 | L | A5 |
| ⌐ OR ⌐ | 38 26 | NONE | 00 | H | 166 A6 | H | AD |
| l OR L | 37 25 | l OR L | E7 | NONE | 165 A5 | IDLE | 03 |
| ⌐ OR ⌐ | 36 24 | NONE | 00 | B | 164 A4 | B | ED |
| o OR O | 35 23 | o OR O | D7 | NONE | 163 A3 | IDLE | 03 |
| ⌐ OR ⌐ | 34 22 | NONE | 00 | INDEX RETN | 162 A2 | REQ. SCR | 48 |
| 4 OR $ | 33 21 | 4 OR $ | F7 | NONE | 161 A1 | IDLE | 03 |
| ⌐ OR ⌐ | 32 20 | NONE | 00 | NONE | 160 A0 | IDLE | 03 |
| j OR J | 31 1F | j OR J | CF | ¼ | 159 9F | ¼ | 9B |
| ⌐ OR ⌐ | 30 1E | NONE | 00 | M | 158 9E | M | 93 |
| t OR T | 29 1D | t OR T | EF | . | 157 9D | . | DB |
| ⌐ OR ⌐ | 28 1C | NONE | 00 | V | 156 9C | V | D3 |
| ½ OR ¼ | 27 1B | ½ OR ¼ | DF | " | 155 9B | " | BB |
| ⌐ OR ⌐ | 26 1A | NONE | 00 | R | 154 9A | R | B3 |
| z OR Z | 25 19 | z OR Z | F5 | I | 153 99 | I | FB |
| ⌐ OR ⌐ | 24 18 | NONE | 00 | A | 152 98 | A | F3 |
| g OR G | 23 17 | g OR G | CE | ) | 151 97 | O | A3 |
| ⌐ OR ⌐ | 22 16 | NONE | 00 | S | 150 96 | S | AB |
| x OR X | 21 15 | x OR X | EE | NONE | 149 95 | IDLE | 03 |
| ⌐ OR ⌐ | 20 14 | NONE | 00 | W | 148 94 | W | EB |
| m OR M | 19 13 | m OR M | DE | CARD REPEAT | 147 93 | 3 | 50 |
| ⌐ OR ⌐ | 18 12 | NONE | 00 | REQ. CR | 146 92 | REQ. CR | 40 |
| ] OR [ | 17 11 | ] OR [ | FE | REQ. BKSP | 145 91 | REQ. BKSP | 4A |
| ⌐ OR ⌐ | 16 10 | NONE | 00 | IDLE | 144 90 | IDLE | 03 |
| | 15 0F | | 70 | J | 143 8F | J | 9F |
| NONE | 14 0E | NONE | 00 | G | 142 8E | G | 97 |
| NONE | 13 0D | NONE | 00 | + | 141 8D | + | DF |
| NONE | 12 0C | NONE | 00 | F | 140 8C | F | D7 |
| NONE | 11 0B | NONE | 00 | P | 139 8B | P | BF |
| NONE | 10 0A | NONE | 00 | : | 138 8A | : | B7 |
| NONE | 9 09 | NONE | 00 | Q | 137 89 | Q | FF |
| NONE | 8 08 | NONE | 00 | , | 136 88 | , | F7 |
| NONE | 7 07 | NONE | 00 | ? | 135 87 | ? | A7 |
| NONE | 6 06 | NONE | 00 | Y | 134 86 | Y | AF |
| NONE | 5 05 | NONE | 00 | NONE | 133 85 | IDLE | 03 |
| NONE | 4 04 | NONE | 00 | - | 132 84 | - | EF |
| IDLE | 3 03 | IDLE | 50 | CARD EJECT | 131 83 | 5 | 38 |
| NONE | 2 02 | NONE | 00 | REQ. TAB | 130 82 | REQ. TAB | 4C |
| NONE | 1 01 | NONE | 00 | LC | 129 81 | LC | 05 |
| NONE | 0 00 | NONE | 00 | NONE | 128 80 | IDLE | 03 |

While a preferred embodiment of the invention has been described in specific detail it will be understood that various omissions and substitutions in the described embodiment may be made without departing from the spirit and scope of the invention as defined by the appended claims.

The embodiments of the invention in which an exclusive property or privilege is claimed are defined as follows:

1. A code translator responsive to input data characters in a first code for selectively producing output data characters in said first or a second code, said translator comprising:
   a data selector means;

read only memory means having addressing inputs responsive to said input data characters and outputs connected to said data selector means, said memory means having stored therein data characters in said second code at addresses addressable by data characters in said first code, whereby each data character read out of said memory means is the translation in said second code of the addressing character;

means for applying the input data characters to said data selector means and the inputs of said memory means;

translate control means operating in a first or a second mode and including means to produce a first or a second select signal, respectively; and, means for applying said first or said second select signal to said data selector means to select as the output therefrom either the data character in said first code or the translation of said data character in said second code;

each character in said first code including a binary bit representing the case of that character and said second code including two case characters with each case character determining the case of the characters following it, said translate control means including:

bistable indicating means operative when said translate control means is operating in said second mode for producing an output indicating the case of the last character selected out of said data selector means;

comparing means for comparing the case of each input data character with the output of said case indicating means, said comparing means including means producing a comparison signal or a non-comparison signal;

means responsive to said non-comparison signal for changing the state of said bistable indicating means and inhibiting the means producing said first and second select signals whereby the input data character and its translation are both blocked by said data selector means:

means responsive to the absence of both said select signals and the output of said bistable indicating means for forcing said data selector means to produce, in said second code, output signals representing a case character, said case character being the same case as that represented by the changed state of said bistable indicating means.

2. A translator as claimed in claim 1 wherein a different number of bits are required to represent a character in said first and second codes.

3. A translator as claimed in claim 1 wherein said translate control means includes means responsive to said comparison signal for enabling the means that produces said second select signal.

4. A translator as claimed in claim 1 wherein certain ones of the characters in said first code do not have a corresponding character in said second code, said translator including means for identifying said certain ones of said characters; and, said translate control means including a means responsive to said identifying means for requesting that a new input data character be supplied and means for emitting a signal that the translator has a character ready for output, said last named means being inhibited by a signal from said identifying means.

5. A translator as claimed in claim 4 wherein each address in said memory means that is addressable by an input data character in said first code has stored therein two identification bits, said identification bits having a special configuration if there is no character in said second code corresponding to the addressing character, said identification bits being applied to said identifying means when said memory is addressed.

6. A translator as claimed in claim 5 wherein said identification bits are coded according to whether or not they are accessed by input data characters representing function codes or non-function codes, said translator including means for applying said identification bits to said comparison means to inhibit operation thereof when said identification bits identify a non-function input data character; and, a further comparison means for comparing said identification bits with the output of said case indicating means to produce either said comparison or said non-comparison signal.

7. A translator as claimed in claim 1 wherein the format of all characters is parallel by bit, serial by character.

8. A code translator responsive to input data characters in a first code for selectively producing output data characters in said first or a second code, said translator comprising:

a data selector means;

read only memory means having addressing inputs responsive to said input data characters and outputs connected to said data selector means, said memory means having stored therein data characters in said second code at addresses addressable by data characters in said first code, whereby each data character read out of said memory means is the translation in said second code of the addressing character;

means for applying the input data characters to said data selector means and the inputs of said memory means;

translate control means operating in a first or a second mode and including means to produce a first or a second select signal, respectively; and, means for applying said first or said second select signal to said data selector means to select as the output therefrom either the data character in said first code or the translation of said data character in said second code;

each character in said second code including a binary bit representing the case of said character, and said first code including two case characters with each case character determining the case of the characters following it, said translator further including:

case select means for sensing each input data character and producing a lower case signal when a sensed input data character represents lower case, or an upper case signal when a sensed input data character represents upper case; and said translate control means further including bistable case indicating means;

bistable case indicating means;

means responsive to said upper case signal for setting said case indicating means if said translate control means is operating in said second mode;

means for applying to said memory means as an additional address bit the output of said case indicating means;

said memory means having stored therein codes representing both an upper case and a lower case translation in said second code for each input data character in said first code, whereby an input data character in combination with said additional address bit may read out of said memory means either an upper case or a lower case translation of each input data character.

9. A code translator responsive to input data characters in a first code for selectively producing output data characters in said first or a second code, said translator comprising:

a data selector means;

read only memory means having addressing inputs responsive to said input data characters and outputs connected to said data selector means, said memory means having stored therein data characters in said second code at addresses addressable by data characters in said first code, whereby each data character read out of said memory means is the translation in said second code of the addressing character;

means for applying the input data characters to said data selector means and the input of said memory means;

translate control means operating in a first or a second mode and including means to produce a first or a second select signal, respectively; and, means for applying said first or said second select signal to said data selector means to select as the output therefrom either the data character in said first code or the translation of said data character in said second code;

each character in said second code including a binary bit representing the case of said character, and said first code including two case characters with each case character determining the case of the characters following it, said translator further including case select means for sensing each input data character and producing a lower case signal when a sensed input data character represents lower case, or an upper case signal when a sensed input data character represents upper case, said translate control means including means operable when said translate control means is in said second mode for emitting a signal requesting another input data character.

10. A translator as claimed in claim 9 wherein said translate control means includes means for normally emitting a character signal indicating that the translator has a character ready for output, and, means responsive to either said upper case signal or said lower case signal for inhibiting the emitting of said character ready signal.

11. A bi-directional multiple code translator operable in a first or a second mode so as to be responsive to first input data characters in a first code for selectively producing first output data characters in said first or a second code, or operable in a third or a fourth mode so as to be responsive to second input data characters in said first or said second code for producing second output data characters in said first code, said translator comprising:

input data selector means;

first and second output data selector means;

a first and a second input data bus for applying said first input data characters to said input data selector means and said first output data selector, and applying said second input data characters to said input data selector and said second output data selector;

read only memory means having addressing inputs responsive to outputs from said input data selector means and outputs connected to both said first and second output data selector means, said read only memory means having stored therein data characters in said first and said second codes addressable by input data characters passed through said input data selector means whereby each data character read out of said memory means is the translation in one code of the addressing character in the other code; and;

translate control means operable in a plurality of modes and responsive to mode indicating signals for controlling said memory means and said input and output data selector means to select as the output from said translator the output of the memory means, the first input data characters from said first bus or the second output data characters from said second bus;

said translate control means comprising a sequential controller operable in varying sequences of states depending upon the mode of selection signals and said first and second input data characters applied thereto, said translate control means having means for normally producing on each cycle first and second output signals when the translate control means is operating in either said first or second mode or third and fourth output signals when it is operating in either said third of fourth mode, said first and third output signals indicating that the translator has a data character ready for output, and said second and fourth output signals indicating that the translator is ready to accept another input data character.

12. A translator as claimed in claim 11 wherein each character in said first code include a binary bit representing the case of said character, but said first code includes two case characters with each case character designating the case of the characters following it, said translate control means further including:

means operable in said second mode for storing an indication of the case of the last output data character;

means for sensing the case of each first input data character;

means for comparing said stored case indication with the case of the input data character; and, means responsive to a signal representing non-comparison from said comparison means for changing said stored indication and forcing said first output data selector to produce in said second code a case character corresponding to the case of said input data character;

said sequential controller being responsive to said non-comparison signal so that the translate control means produces one of said first output signals but does not produce one of said second output signals.

13. A translator as claimed in claim 12 wherein the changed stored indication is subsequently compared with the input data character that caused the change, where said comparison means produces a signal representing comparison, said sequential controller being responsive to said comparison signal for generating said first and said second output signals as well as a signal enabling said first output data selector to pass the output from said memory means.

14. A translator as claimed in claim 11 wherein each character in said first code includes a binary bit representing the case of said character, but said second code includes two case characters with each case character designating the case of the characters following it, said translate control means further including:
means for sensing each second input data character and producing a first or a second case signal if one of said two case characters is sensed;
said sequential controller, when operating in said fourth mode, being responsive to the case signal for producing one of said fourth output signals while inhibiting the corresponding third output signal and the passage of any data character through said second output data selector.

15. A translator as claimed in claim 11 wherein there are characters in said first code that do not have a corresponding character in said second code, and wherein each address in said memory means stores identification signals indicating whether or not the input data character accessing the address has a corresponding character in said second code, said translate control means further including:
means for sensing said identification bits when a first input data character accesses said memory, said sensing means producing a signal indicating no correspondence,
said controller, when operating in said second mode being responsive to said signal indicating no correspondence for producing one of said second output signals without producing one of said first output signals.

16. A code translator for translating input data characters in a first code into output code characters in a second code, each character in said first code including a binary bit representing the case of the character but said second code including two case characters with each case character determining the case of the characters following it, said translator comprising:
memory means having addressing inputs responsive to said input data characters, said memory means having stored therein data characters in said second code at addresses addressable by data characters in said first code whereby each data character read out of said memory means is the translation in said second code of the addressing character;
means for applying input data characters to the addressing inputs of said memory means;
sensing means for sensing the case of each input data character;
storage means responsive to said sensing means for storing an indication of the case of the preceding input data character;
comparing means responsive to said sensing means and said storage means for comparing the case of each input data character with the case of the preceding input data character,
means responsive to said comparing means and said storage means when said cases are not equal for generating one of said case characters as the output data character from said translator; and,
means responsive to said comparing means and said storage means when said cases are equal for selecting the output of said memory means as the output data character from said translator.

17. A code translator as claimed in claim 16 and further including:
means responsive to said comparing means when said compared cases are unequal for changing the indication stored by said storage means whereby each input data character that causes the generation of one of said case characters subsequently causes the translation of said character, read out of said memory, to be applied as an output data character from said translator.

18. A code translator for translating input data characters in a first code into output data characters in a second code, each character in said second code including a binary bit representing the case of the character but said first code including two case characters with each case character determining the case of the characters following it, said translator comprising:
memory means having addressing inputs responsive to said input data characters for producing output data characters, said memory means having stored therein data characters in said second code at addresses addressable by data characters in said first code whereby each data character read out of said memory means is the translation in said second code of the addressing character;
means for applying input data characters to the addressing inputs of said memory means;
sensing means for sensing each input data character to determine if it is one of said case characters; and,
means responsive to said sensing means when one of said case characters is sensed for requesting another input data character while inhibiting any output from said memory in response to said sensed case character.

19. A code translator as claimed in claim 18 wherein said memory has stored therein, in said second code, an upper case translation and a lower case translation of the characters of said first code, said translator further including:
bistable case indicating means;
means responsive to said sensing means for setting said indicating means when one of said case characters is sensed and resetting said indicating means when the other of said case characters is sensed; and,
means for applying the output of said indicating means to said memory means as an addressing signal whereby the upper or lower case translation of an input data character is read out of said memory means depending upon the state of said indicating means.

20. A translator for translating input data characters in a first code into output data characters in a second code, said first code including some characters for which there are no equivalent translated characters in said second code, said translator comprising:
memory means,
means for applying input data characters to said memory as addressing signals;
said memory means having stored therein, in said second code, translations of some characters of said first code;
said memory means also having stored therein, at each location addressable by a character in said first code, an indication of whether or not there is an equivalent character in said second code, sensing means for sensing said indication for the addressed location each time said memory means is addressed by an input data character;

gating means responsive to said memory means and said sensing means for blocking the output from said memory means when said sensing means senses an indication that there is no equivalent character in said second code corresponding to the input data character.

21. A translator as claimed in claim 20 and further comprising means responsive to said sensing means for generating a signal requesting a new input data character when the sensing means senses that the present input data character has no equivalent in said second code.

22. A translator as claimed in claim 20 wherein said gating means includes means responsive to said memory means and said sensing means for passing the output of said memory means when said sensing means senses an indication that the input data character has an equivalent character in said second code.

* * * * *